United States Patent [19]
Shibata et al.

[11] Patent Number: 5,666,003
[45] Date of Patent: Sep. 9, 1997

[54] PACKAGED SEMICONDUCTOR DEVICE INCORPORATING HEAT SINK PLATE

[75] Inventors: Kazutaka Shibata; Sadahito Nishida, both of Kyoto, Japan

[73] Assignee: Rohm Co. Ltd., Kyoto, Japan

[21] Appl. No.: 551,925

[22] Filed: Oct. 23, 1995

[30] Foreign Application Priority Data

| Oct. 24, 1994 | [JP] | Japan | 6-284080 |
| Oct. 24, 1994 | [JP] | Japan | 6-284081 |
| Jul. 31, 1995 | [JP] | Japan | 7-194662 |
| Jul. 31, 1995 | [JP] | Japan | 7-194663 |
| Jul. 31, 1995 | [JP] | Japan | 7-194664 |

[51] Int. Cl.⁶ .............. H01L 23/34; H01L 23/28
[52] U.S. Cl. ............ 257/796; 257/712; 257/713; 257/717; 257/782
[58] Field of Search .............. 257/712, 713, 257/717, 782, 787, 796

[56] References Cited

U.S. PATENT DOCUMENTS

| 4,721,995 | 1/1988 | Tanizawa | 257/777 |
| 4,857,989 | 8/1989 | Mori et al. | 257/762 |
| 5,430,331 | 7/1995 | Hamzehdoost et al. | 257/796 |

*Primary Examiner*—Carl W. Whitehead, Jr.
*Attorney, Agent, or Firm*—Michael D. Bednarek; Kilpatrick Stockton LLP

[57] ABSTRACT

A packaged semiconductor device is provided which comprises a die pad, a semiconductor chip mounted on the die pad, a plurality of leads electrically connected to the semiconductor chip, a heat sink plate bonded to the die pad opposite to the semiconductor chip, and a resin package enclosing at least the semiconductor chip together with the die pad and a part of each lead. The heat sink plate has a peripheral portion partially overlapping each lead but electrically insulated.

8 Claims, 27 Drawing Sheets

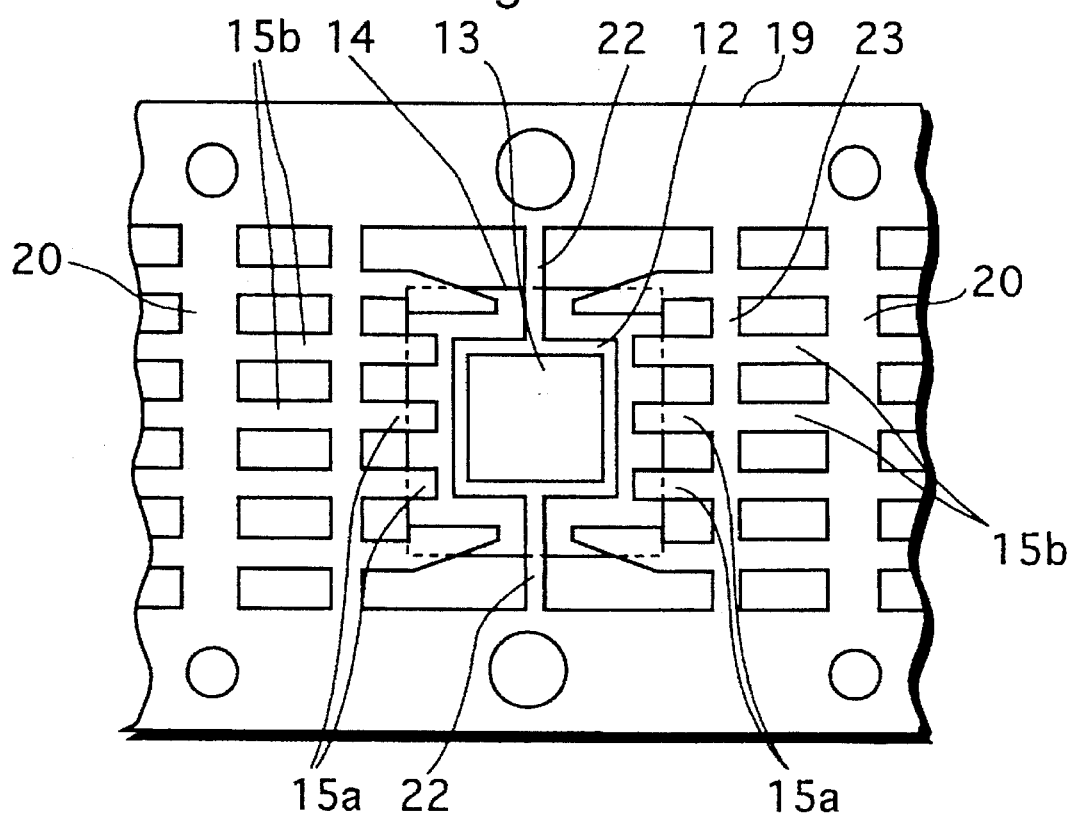
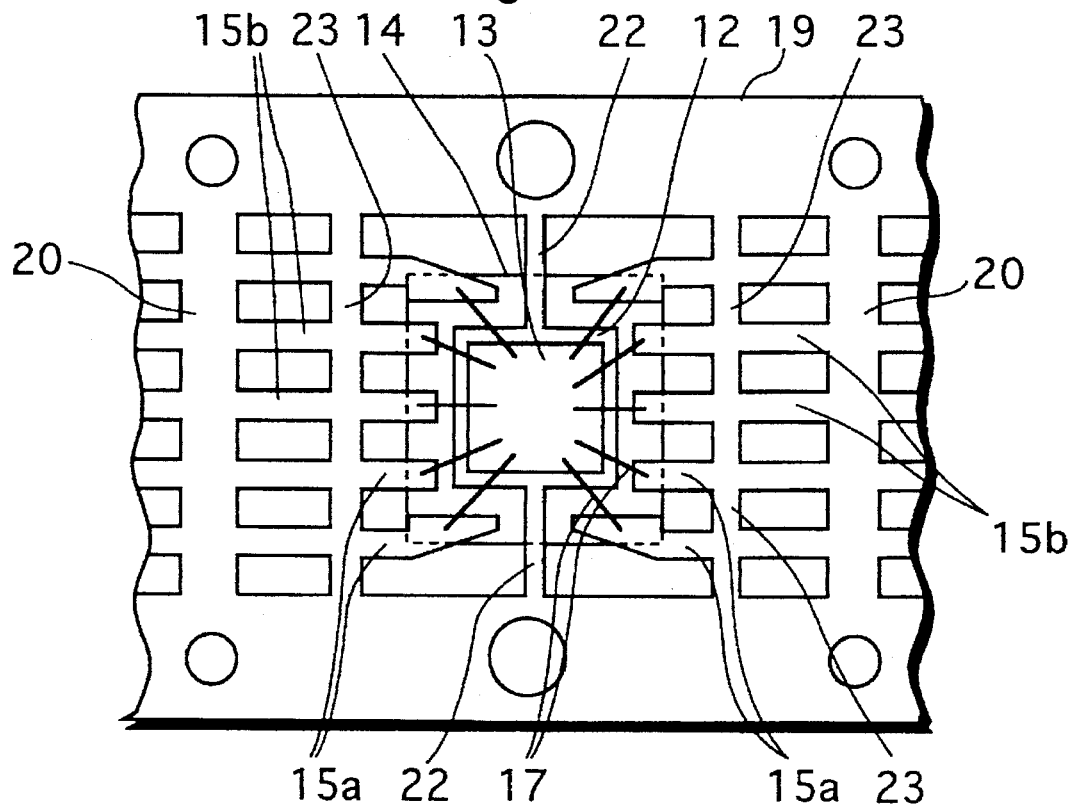

PACKAGED SEMICONDUCTOR DEVICE INCORPORATING HEAT SINK PLATE

BACKGROUND OF THE INVENTION

1. Field of the Invention

This invention relates to a packaged semiconductor device of the type which incorporates a heat sink plate for effectively dissipating the heat generated by a semiconductor chip. The present invention also relates to a method for making such a semiconductor device. The present invention further relates to supersonic bonding which can be advantageously used in making such a semiconductor device.

2. Description of the Related Art

As is well known, certain types of semiconductor devices generate a lot of heat during operation. For example, power ICs for motor drive, certain gate array devices and ultra LSIs are known to generate much heat. Therefore, these semiconductor devices equally need to incorporate a heat sink plate within the resin package for effectively dissipating the generated heat, as shown in FIG. 36 of the accompanying drawings.

Specifically, as shown in FIG. 36, a prior art packaged semiconductor device of this type comprises a semiconductor chip 5 mounted on a heat sink plate 4 within a resin package 1. The chip 5 is electrically connected to a plurality of leads 2 via respective bondwires 6. An inner portion of each lead 2 is attached to the heat sink plate a via an adhesive layer 3, whereas an outer portion of the lead 2 is extended out of the package 1. In operation, the heat sink plate 4 serves to dissipate heat which is generated by the semiconductor chip.

However, the prior art semiconductor device has been found to have the following disadvantages.

First, before molding the resin package 1 in manufacturing the prior art semiconductor device, the heat sink plate 4 need be supported solely by the tip ends of the respective leads 2 via the adhesive layer 3. Since the leads 2 need be extremely slenderized for enabling a dense arrangement in a limited size, they cannot provide a sufficiently rigid support if the heat sink plate 4 is rendered relatively heavy. Therefore, it is difficult to increase the heat dissipating ability of the heat sink plate 4 beyond a certain limit.

Secondly, in bonding the bondwires 6 to the respective leads 2 before molding the resin package 1, the heat sink plate 4 need be placed on a heater block (not shown) to supply heat required for performing a thermo-compression bonding method. However, since the adhesive layer 3 blocks heat transmission from the heat sink plate 4 to each lead 2, it is difficult to properly and efficiently bond the wire 6 to the lead 2.

SUMMARY OF THE INVENTION

It is, therefore, an object of the present invention to provide a packaged semiconductor device which is capable of incorporating a relatively heavy heat sink plate for providing an improved heat dissipating ability while preventing unexpected deformation of leads.

Another object of the present invention is to provide a method of making such a semiconductor device.

A further object of the present invention is to provide a supersonic bonding method which can be advantageously used for making such a semiconductor device.

Still another object of the present invention is to provide a supersonic bonding apparatus which can be advantageously used for making such a semiconductor device.

According to a first aspect of the present invention, there is provided a packaged semiconductor device comprising:

a die pad;

a semiconductor chip mounted on the die pad;

a plurality of leads electrically connected to the semiconductor chip;

a heat sink plate bonded to the die pad opposite to the semiconductor chip, the heat sink plate have a peripheral portion partially overlapping each of the leads but electrically insulated therefrom; and a resin package enclosing at least the semiconductor chip together with the die pad and a part of each said lead.

According to the arrangement described above, the die pad and the leads may originate from a common leadframe, and the heat sink plate need not be bonded to the die pad. Thus, the leads will not be deformed under the weight of the heat sink plate even if the heat sink plate is enlarged in size (namely, area and thickness) for providing an increased heat dissipating ability.

On the other hand, when the heat sink plate is placed on a heater block for performing wire bonding with respect to the leads, each of the leads may be elastically deformed into direct contact with the heat sink plate because there is no need to provide an intervening bonding layer between the heat sink plate and the lead. Thus, the heat from the heater block can be effectively transmitted to the lead for facilitating the wire bonding process.

The heat sink plate may be directly bonded to the die pad without intervention of a separate bonding layer. Such an arrangement improves heat transmission between the die pad and the heat sink plate. In this case, the heat sink plate may be bonded to the die pad only in a limited central region while holding the entirety of the die pad in direct contact with the heat sink plate.

Each of the leads may be electrically insulated from the heat sink plate by a spacing therebetween. Alternatively, each of the leads may be electrically insulated from the heat sink plate by an insulating adhesive tape attached to the lead. Further, each of the leads may be electrically insulated from the heat sink plate by a spacing therebetween as well as by an insulating adhesive tape attached to the lead.

The heat sink plate may have a surface exposed outside the resin package to promote heat dissipation. In this case, the exposed surface of the heat sink plate may be formed with depressions for providing an increased heat dissipating area.

Alternatively, the heat sink plate may be fully enclosed in the resin package to improve sealing for the semiconductor chip. In this case, again, the heat sink plate may have a non-exposed surface formed with depressions for improving anchorage within the resin package.

For additionally improving heat dissipation of the semiconductor device, the die pad may be integrally formed with at least one heat dissipating fin located outside the resin package.

According to a second aspect of the present invention, there is provided a method for making a packaged semiconductor device comprising the steps of:

preparing a leadframe which has at least one die pad and a plurality of leads associated with the die pad;

bonding the die pad to a heat sink plate in such a manner that a peripheral portion of the heat sink plate partially overlaps while being electrically insulated from each of the leads;

bonding a semiconductor chip on the die pad opposite to the heat sink plate;

electrically connecting the semiconductor chip to each said lead by bondwires; and molding a resin package which encloses at least the semiconductor chip together with the die pad and a part of each said lead.

According to a preferred embodiment of the method, the step of bonding the die pad to the heat sink plate comprises placing the heat sink plate on a support base, placing the die pad on the heat sink plate, pressing a presser tool against the die pad, and supersonically vibrating the presser tool while the presser tool is held pressed against the die pad. In this case, the presser tool may be held pressed against the die pad only in a limited central region thereof. Further, the presser tool may have engaging teeth for engagement with the die pad, and the support base may also have engaging teeth for engagement with the heat sink plate.

According to another preferred embodiment of the method, an insulating adhesive tape may be attached to inner portions of the respective leads prior to performing the step of bonding the die pad to the heat sink plate.

According to a third aspect of the present invention, there is provided a method for supersonically bonding a first element to a second element comprising the steps of:

bringing a presser tool into contact with the first element for pressing the first element against the second element;

supersonically vibrating the presser tool while the first element is held pressed against the second element;

detecting vibration of the second element; and stopping or slowing down the supersonic vibration of the presser tool when the vibration of the second element reaches a predetermined state.

If the supersonic bonding method described above is used for making a packaged semiconductor device, the first element may be a die pad of a leadframe, whereas the second element may be a metallic heat sink plate. Alternatively or additionally, the first element may be a bondwire, whereas the second element may be a lead of a leadframe.

According to a fourth aspect of the present invention, there is provided an apparatus for supersonically bonding a first element to a second element comprising:

a presser tool which is brought into contact with the first element for pressing the first element against the second element;

a supersonic generator for supersonically vibrating the presser tool while the first element is held pressed against the second element;

a controller for controlling the supersonic generator; and a vibration sensor for detecting vibration of the second element and for causing the controller to stop or slow down the supersonic generator when the vibration of the second element reaches a predetermined state.

Other objects, features and advantages of the present invention will be fully understood from the following detailed description given with reference to the accompanying drawings.

BRIEF DESCRIPTION OF THE DRAWINGS

In the accompanying drawings:

FIG. 11 is a plan view similar to FIG. 3 but showing the same leadframe after bonding a semiconductor chip;

FIG. 12 a plan view similar to FIG. 3 but showing the same leadframe after wire bonding;

DETAILED DESCRIPTION OF THE PREFERRED EMBODIMENTS

Figure 1:
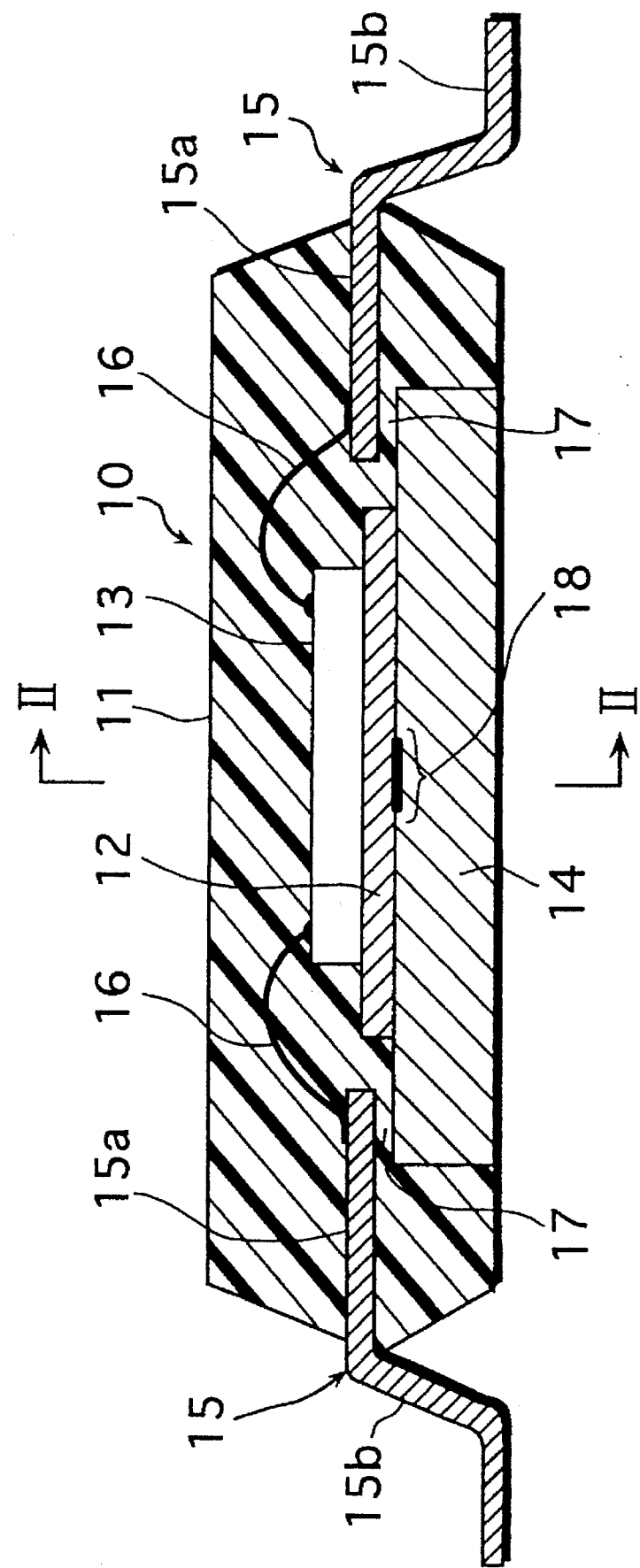
FIG. 1 is a sectional views showing a packaged semiconductor device according to a first embodiment of the present invention.
Figure 2:
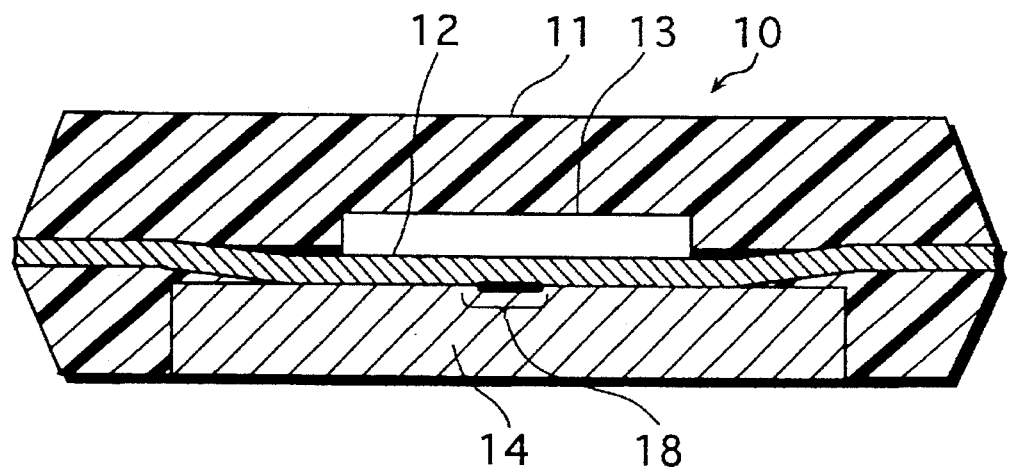
FIG. 2 is a sectional view taken on lines II—II in FIG. 2.

FIGS. 1 and 2 of the accompanying drawings illustrate a dual-in-line type packaged semiconductor device according to a first embodiment of the present invention. The semiconductor device generally designated by reference numeral 10 comprises a resin package 11 which encloses a semiconductor chip 13 bonded on a die pad or island 12. The package 11 may be preferably made of epoxy for example. The chip 13 may be bonded on the die pad 12 by means of a silver paste or a low melting point metal such as solder.

The die pad 12 is mounted on a heat sink plate 14 in direct contact therewith as a whole. The heat sink plate 14 may be square or rectangular and preferably made of copper, aluminum, a copper alloy or an aluminum alloy for ensuring good heat dissipation. However, the heat sink plate 14 may be made of a non-metal material as long as such a material ensures good heat dissipation.

The semiconductor chip 13 is electrically connected to a plurality of leads 15 via respective bondwires 16. Each of the leads 15 has an inner flat portion 15a located within the package 11, and an outer bent portion 15b extending out of the package 11. The outer bent portion 15b is bent to become substantially flush with the bottom surface of the package 11 for conveniently mounting on a circuit board (not shown).

According to the first embodiment shown in FIGS. 1 and 2, the heat sink plate 14 has a bottom surface flush with the bottom surface of the package 11 for exposure to the exterior. Further, the heat sink plate 14 has marginal portions which laterally overlap the inner flat portions 15a of the respective leads 15 with a small spacing 17. The resin material of the package 11 occupies the spacing 17, so that the respective leads 15 are electrically insulated from the heat sink plate 14.

Further, according to the first embodiment shown in FIGS. 1 and 2, the die pad 12 is directly bonded to the heat sink plate 14 in a limited central region 18 without the use of a separate bonding layer (e.g. adhesive layer). Such localized direct bonding may be preferably performed by a supersonic bonding method, as described hereinafter. However, other direct bonding method such as spot welding is also applicable.

With the arrangement described above, the entirety of the die pad 12 is held in direct contact with the heat sink plate 14 in spite of localized bonding therebetween. Thus, the heat generated by the semiconductor chip 13 in operation can be effectively transmitted to the heat sink plate 14 for dissipation from the exposed bottom surface of the heat sink plate 14.

On the other hand, since the die pad 12 is bonded to the heat sink plate 14 only in the limited central region 18, these two elements 12, 14 can thermally expand and contract substantially independently of each other even if they differ in coefficient of thermal expansion. Thus, it is possible to prevent or reduce thermal stresses between the die pad 12 and the heat sink plate 14, thereby avoiding damages to the interior structure which might be caused by such thermal stresses.

The packaged semiconductor device according to the first embodiment may be preferably made in the following manner.

Figure 3:
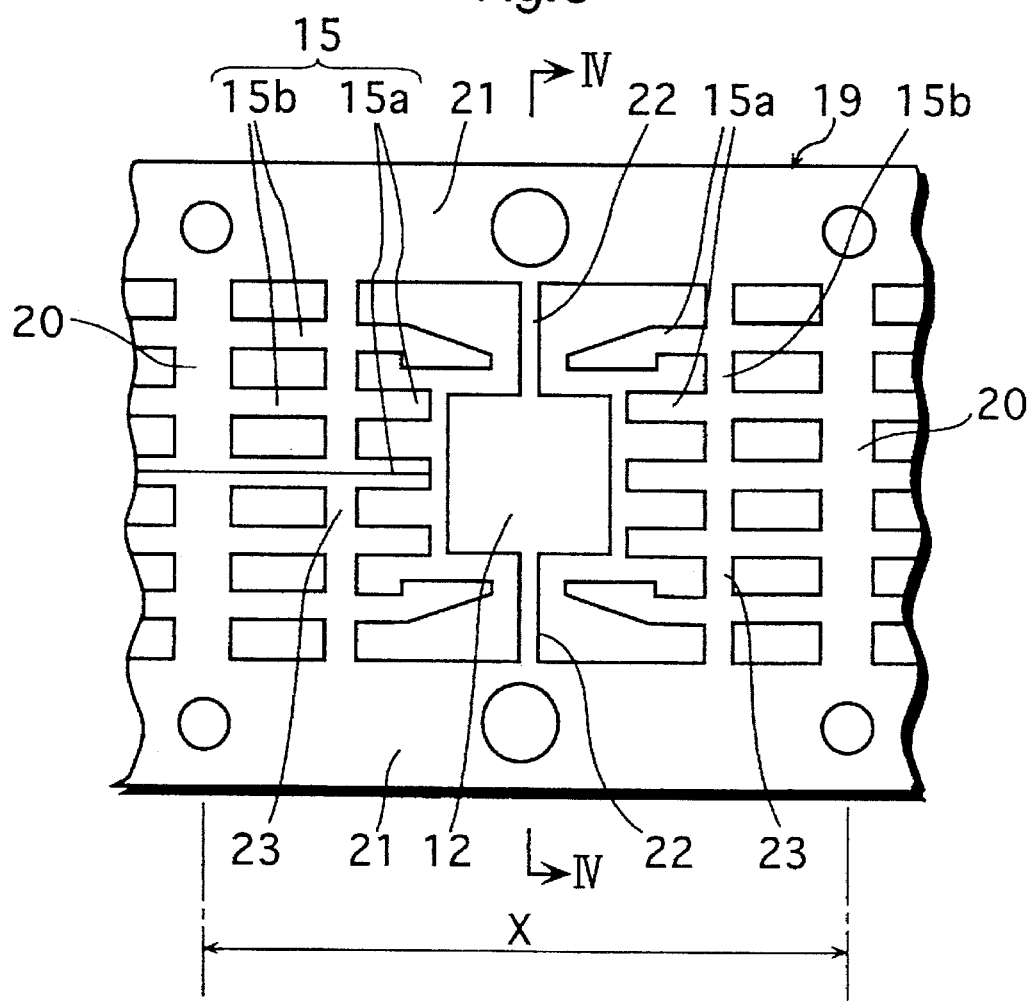
FIG. 3 is a plan view showing a leadframe used for making the semiconductor device illustrated in FIGS. 1 and 2.
Figure 4:
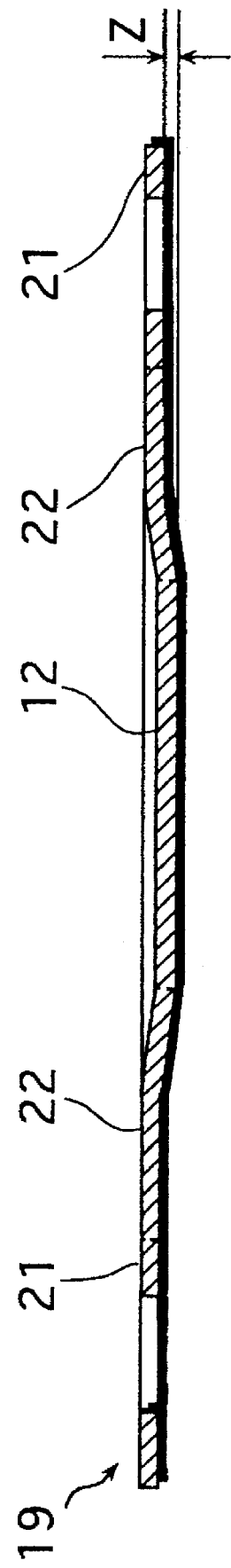
FIG. 4 is a sectional view taken on lines IV—IV in FIG. 3.

First, as shown in FIGS. 3 and 4, a suitably configured leadframe 19 is prepared. Such a leadframe may be prepared by punching a thin metal sheet which may be made of a copper alloy or an iron-nickel alloy for example. The leadframe 19 comprises a pair of side bands 21 connected together by a plurality of section bars 20. Two adjacent ones of the section bars 20 define a unit region X which contains a die pad 12 flanked, longitudinally of the leadframe 19, by two groups of leads 15. The die pad 12 is supported by the respective side bands 21 via support bars 22, whereas the leads 15 in each group extend toward the die pad 12 from a corresponding section bar 20 and are connected together by a tie bar 23 extending transversely of the leadframe 19. Each lead 15 is divided at the tie bar 23 into an inner portion 15a closer to the die pad 12 and an outer portion 15b farther from the die pad 12. As shown in FIG. 4, the die pad 12 is downwardly offset from the normal plane of the leadframe 19 by a predetermined amount Z of 0.2–0.4 mm (200–400 micrometers) for example.

Figure 5:
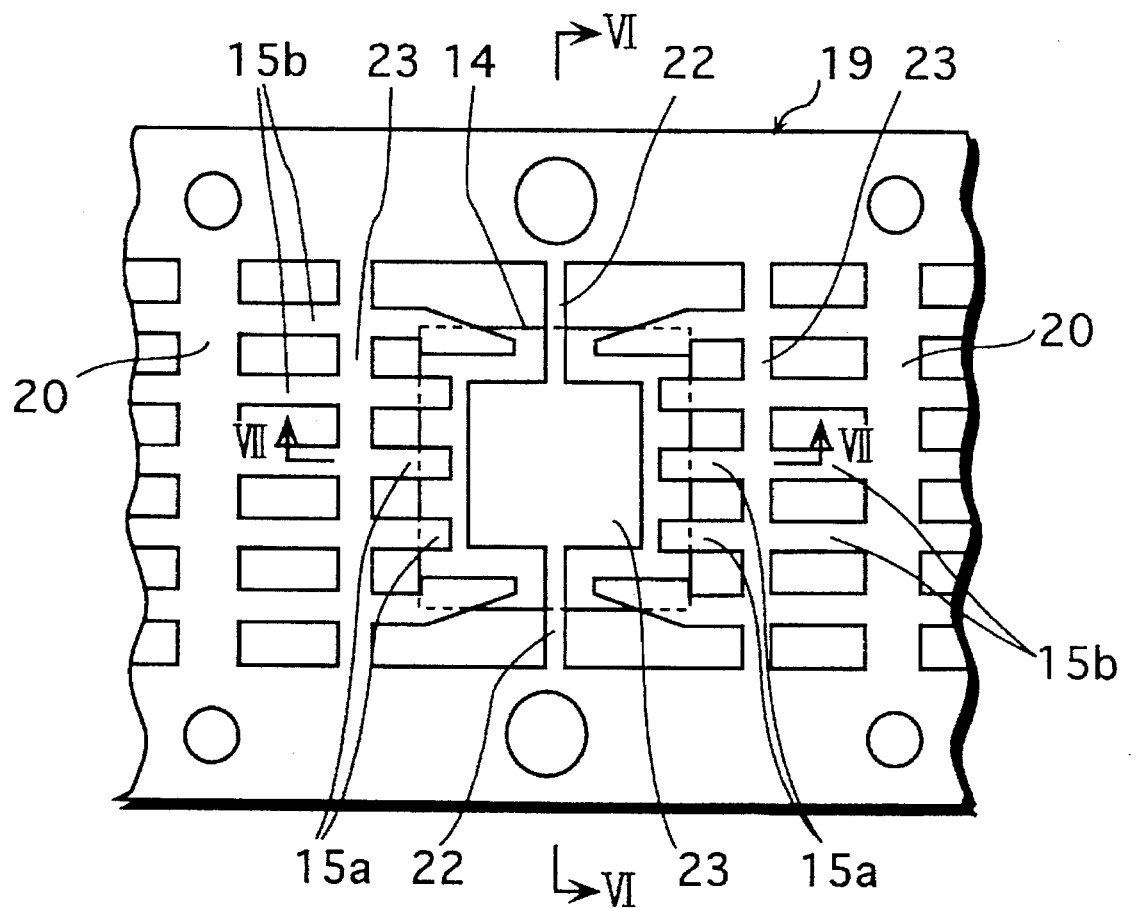
FIG. 5 is a plan view similar to FIG. 3 but showing the same leadframe after bonding a heat sink plate.
Figure 6:
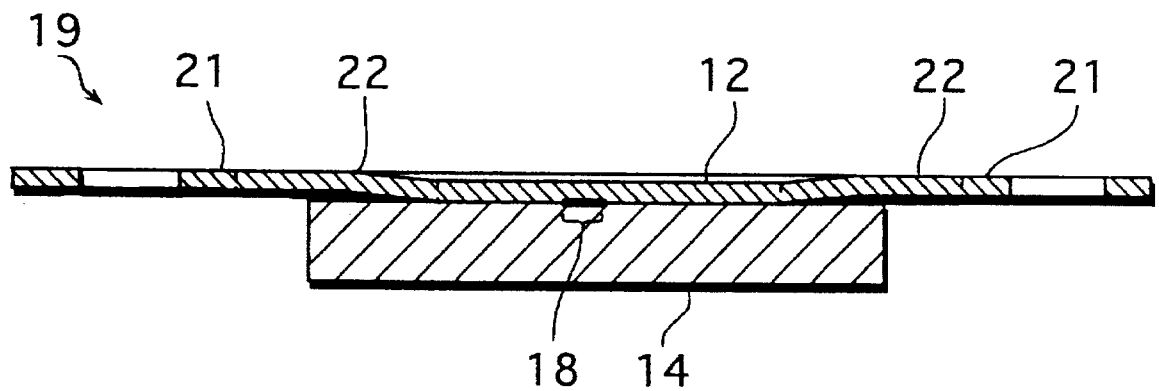
FIG. 6 is a sectional view taken on lines VI—VI in FIG. 5.
Figure 7:
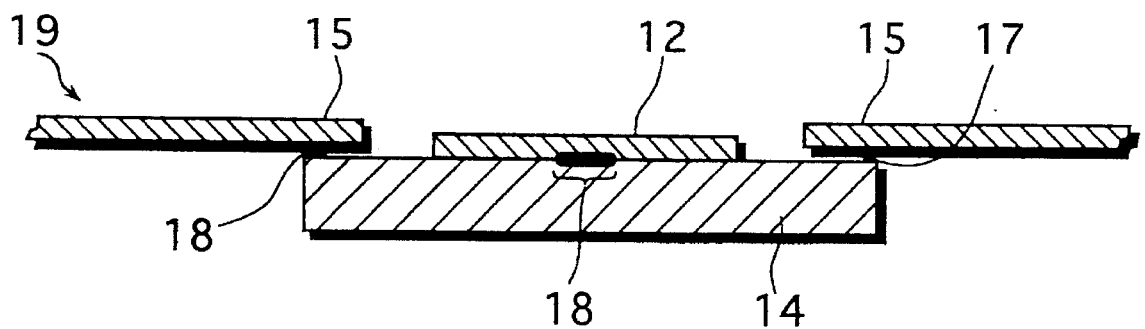
FIG. 7 is a sectional view taken along lines VII—VII in FIG. 5.

Then, as shown in FIGS. 5–7, a metallic heat sink plate 14 is bonded to the bottom surface of the die pad 12 in such a manner that a peripheral portion of the heat sink plate 14 partially overlaps the inner portions 15a of the respective leads 15. As previously described, the bonding between the die pad 12 and the heat sink plate 14 is preferably effected only in a limited central region 18. This bonding region may be minimally reduced as long as a sufficient bonding or supporting strength between the die pad 12 and the heat sink plate 14 is ensured. Because of the downward offset of the die pad 12 relative to the normal plane of the leadframe 19, a spacing 17 is formed between each lead 15 and the heat sink plate 14.

As previously described, the heat sink plate 14 may be preferably bonded to the die pad 12 by a supersonic bonding method. An example of such supersonic bonding is illustrated in FIGS. 8–10.

Figure 8:
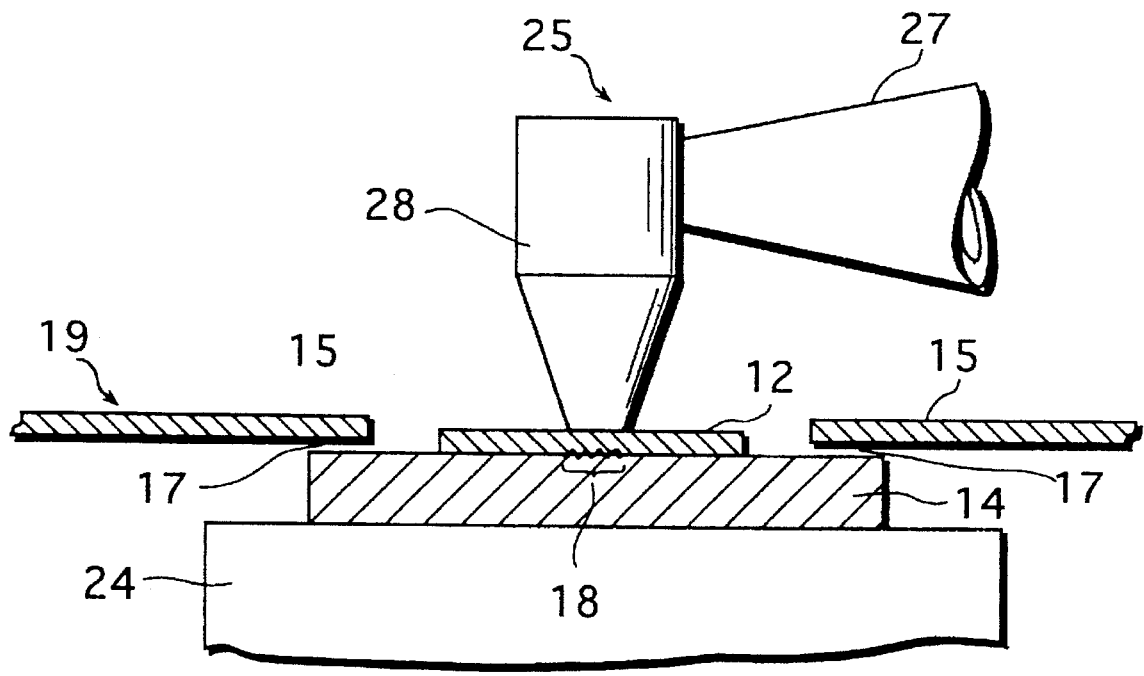
FIGS. 8 and 9 are sectional views showing the step of bonding the heat sink plate.
Figure 9:
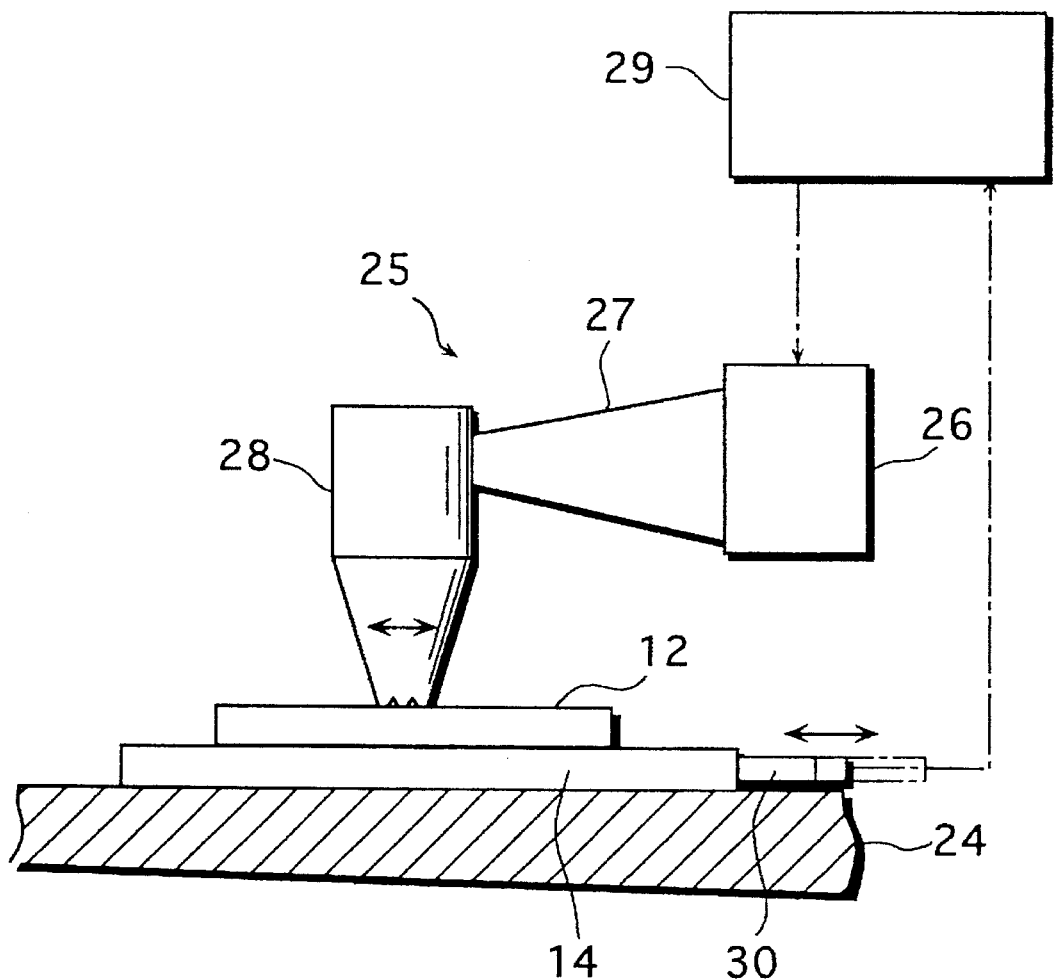
Figure 10:
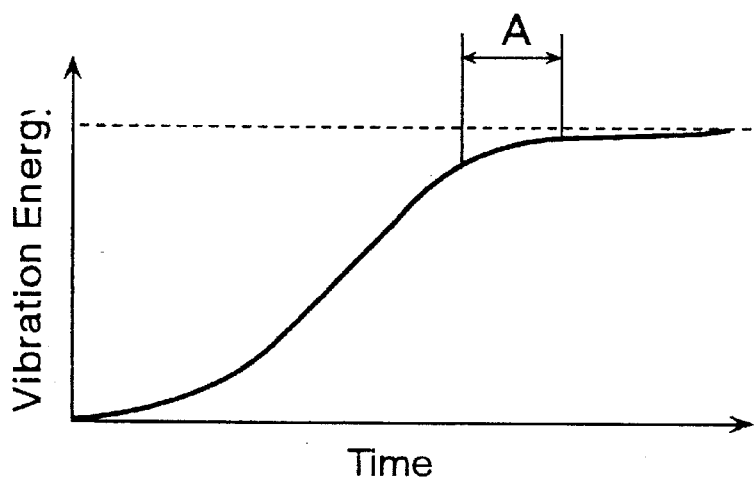
FIG. 10 is a graph showing an increase of vibration energy as the step of bonding the heat sink plate proceeds.

As shown in FIGS. 8 and 9, for supersonic bonding, use is made of a supersonic bonding apparatus 25 which comprises a supersonic generator 26 connected to a presser tool 28 through a horn 27. The presser tool 28 together with the supersonic generator 26 and the horn 27 is vertically movable toward and away from a support base 24 on which the heat sink plate 14 is placed. The supersonic generator 26 is driven for supersonic vibration by a controller 29 (see FIG. 9). A vibration sensor 30 is attached to the heat sink plate 14 for detecting the vibration of the heat sink plate 14 and for feeding detection signals to the controller 29. It should be appreciated that only the die pad 12 of the leadframe 19 is shown in FIG. 9 for purposes of better illustration.

In operation, the presser tool 28 is lowered into pressing contact with a central portion of the die pad 12, and the supersonic generator 26 is actuated for supersonic vibration. The amplitude of vibration may be in the order of 20 micrometers for example. Initially, the die pad 12 vibrates supersonically with the presser tool 28 relative to the heat sink plate 14, so that frictional heat is generated at the interface between the die pad 12 and the heat sink plate 14. Combined with the pressure applied by the presser tool 28, the frictional heat causes thermal fusion between the die pad 12 and the heat sink plate 14 at the limited central region where the pressure is applied.

As the thermal fusion or bonding proceeds, the heat sink plate 14 starts vibrating with the die pad 12. When the bonding step is complete, the heat sink plate 14 vibrates synchronously with the die pad 12. Such completion of the bonding step may be detected by the vibration sensor 30 attached to the heat sink plate 12.

Specifically, the vibration energy (kinetic energy) of the heat sink plate 14 increases up to a certain limit as the bonding between the die pad 12 and the heat sink plate 14 proceeds. This is illustrated in FIG. 10 wherein the abscissa represents time while the ordinate represents the vibration energy of the heat sink plate 14. Thus, when the vibration energy of the heat sink plate 14 increases to a range A in FIG. 10 which is close to a maximum energy value, it is considered that the bonding between the die pad 12 and the heat sink plate 14 is almost complete. The vibration sensor 30 detects such a state and causes the controller 29 to stop or slows down the supersonic generator 26. It is to be understood that the supersonic bonding step should be preferably finished in the range A (slightly earlier than complete) because it is otherwise feared that the die pad 12 and/or the heat sink plate 14 may be thermally damaged.

The vibration sensor 30 may be a contact type pressure sensor which is capable of detecting high frequency vibration, as shown in FIG. 9. Alternatively, the vibration sensor 30 may be replaced by a non-contact type vibration sensor which acoustically or electromagnetically detects the vibratory state of the heat sink plate 14 by utilizing the Doppler effect.

After bonding the die pad 12 to the heat sink plate 14, a semiconductor chip 13 is bonded on the die pad 12 by soldering or by using a silver paste, as shown in FIG. 11.

Figure 13:
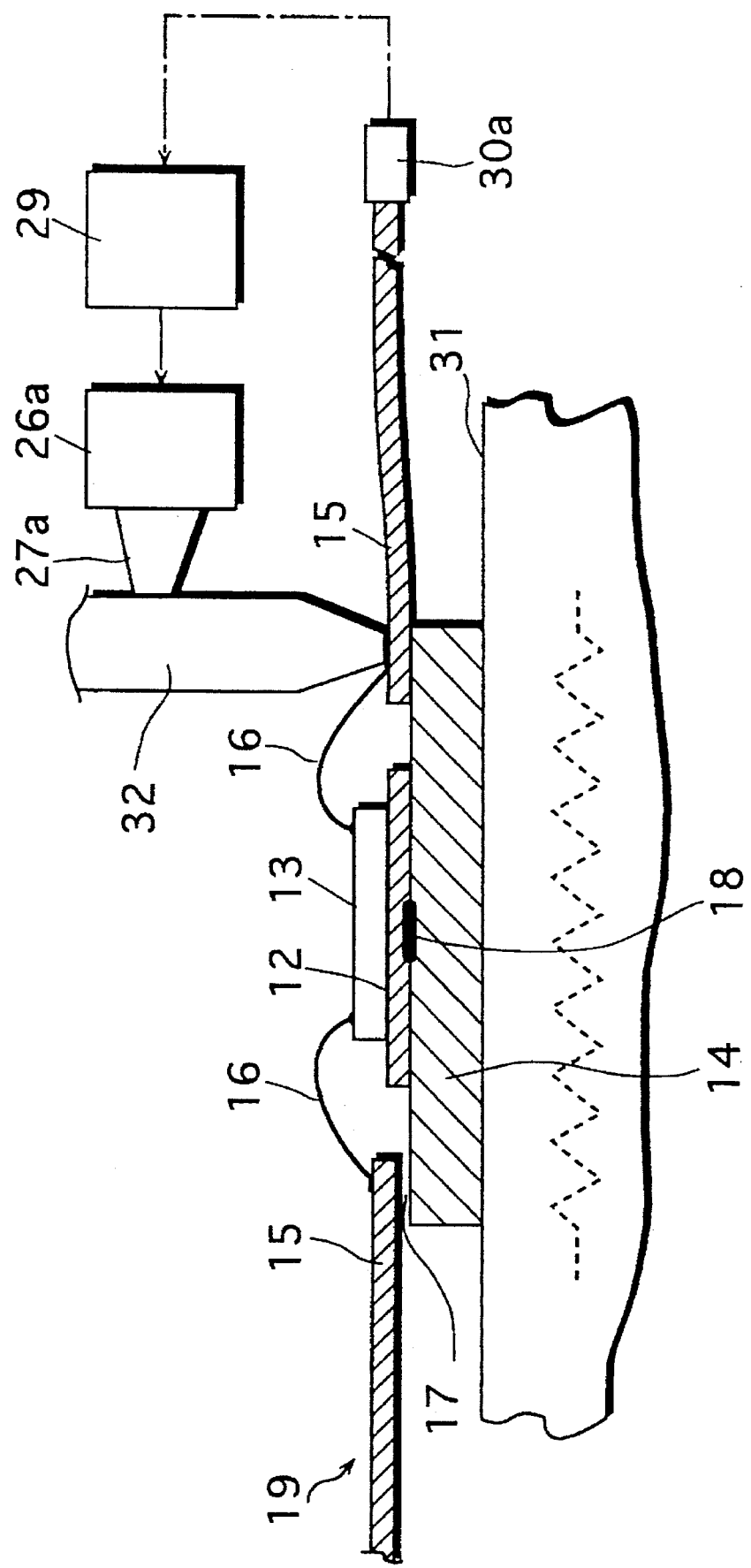
FIG. 13 is a sectional view showing how the wire bonding process is performed.

Then, as shown in FIGS. 12 and 13, the semiconductor chip 13 is electrically connected to the inner portion 15a of each lead 15 through a bondwire 16 by using a capillary tool 32. Such wire bonding comprises a first bonding step for attaching one end of the bondwire 16 to the semiconductor chip 13 and a second bonding step for attaching the other end of the bondwire 16 to the lead 15. In each of the first and second wire bonding steps, the heat sink plate 14 is supported on a heater block 31. The first bonding step may be a known ball bonding step wherein a ball end of the bondwire 16 is pressed against the semiconductor chip 13 for bonding thereto under the heat from the heater block 31.

On the other hand, the second wire bonding step may be preferably performed by utilizing supersonic vibration. For this purpose, the capillary tool 32 is connected to a supersonic generator 26a via a horn 27a. The supersonic generator 26a is driven for supersonic vibration by the controller 29 which may be commonly used for the supersonic generator 26 of the supersonic bonding apparatus 25 shown in FIG. 9. A vibration sensor 30a is attached to a suitable portion of the leadframe 19 for detecting the vibration of the lead 15.

In the second wire bonding step, the capillary tool 32 is lowered to elastically deform each lead 15 into pressing contact with the heat sink plate 14, as shown in FIG. 13. Thus, the heat generated by the heater block 31 is effectively transmitted to the lead 15 via the heat sink plate 14. Initially, the bondwire 16 vibrates supersonically with the capillary tool 32 relative to the lead 15, so that the bondwire 16 is rubbed against the lead 15 with resultant generation of frictional heat. Combined with the pressure applied by the capillary tool 32 as well as the heat from the heater block 31, the frictional heat causes thermal fusion between the bondwire 16 and the lead 15. As the thermal fusion or bonding proceeds, the lead 15 or the leadframe 19 as a whole starts vibrating with the bondwire 16. When the bonding step is almost complete, the leadframe 19 vibrates synchronously with the capillary tool 32, thereby causing the the vibration sensor 30a to generate a signal for stopping or slowing down the supersonic vibrator 26a (see FIG. 10).

After finishing the second wire bonding step, the capillary tool 32 is raised away from the lead 15. As a result, the lead 15 elastically restores to its natural state to form the spacing 17 between the lead 15 and the heat sink plate 14.

Figure 14:
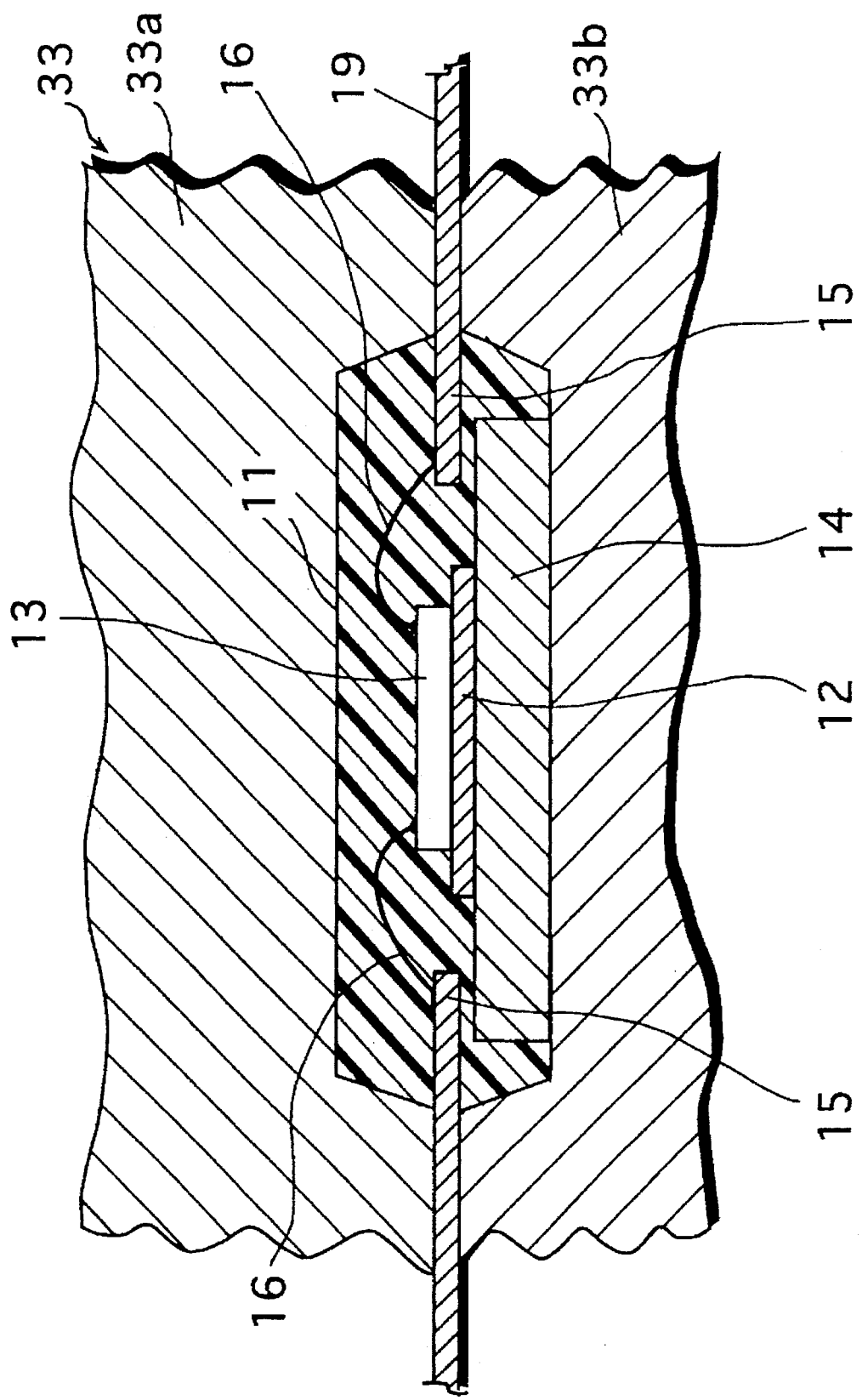
FIG. 14 is a sectional view showing the step of molding a resin package.

Then, as shown in FIG. 14, the semiconductor chip 13 together with its associated elements is placed in a mold 33 which includes an upper mold member 33a and a lower mold member 33b, and a known transfer molding step is carried out to form a package 11 of an epoxy resin.

Thereafter, other necessary steps are performed which include solder plating of the leadframe 19, marking the resin package 11, cutting of the support bars 22 and tie bars 23 (see FIG. 3), cutting and bending of the leads 15, and so on. As a result, the individual semiconductor device 10 shown in FIGS. 1 and 2 is thus obtained.

Figure 15:
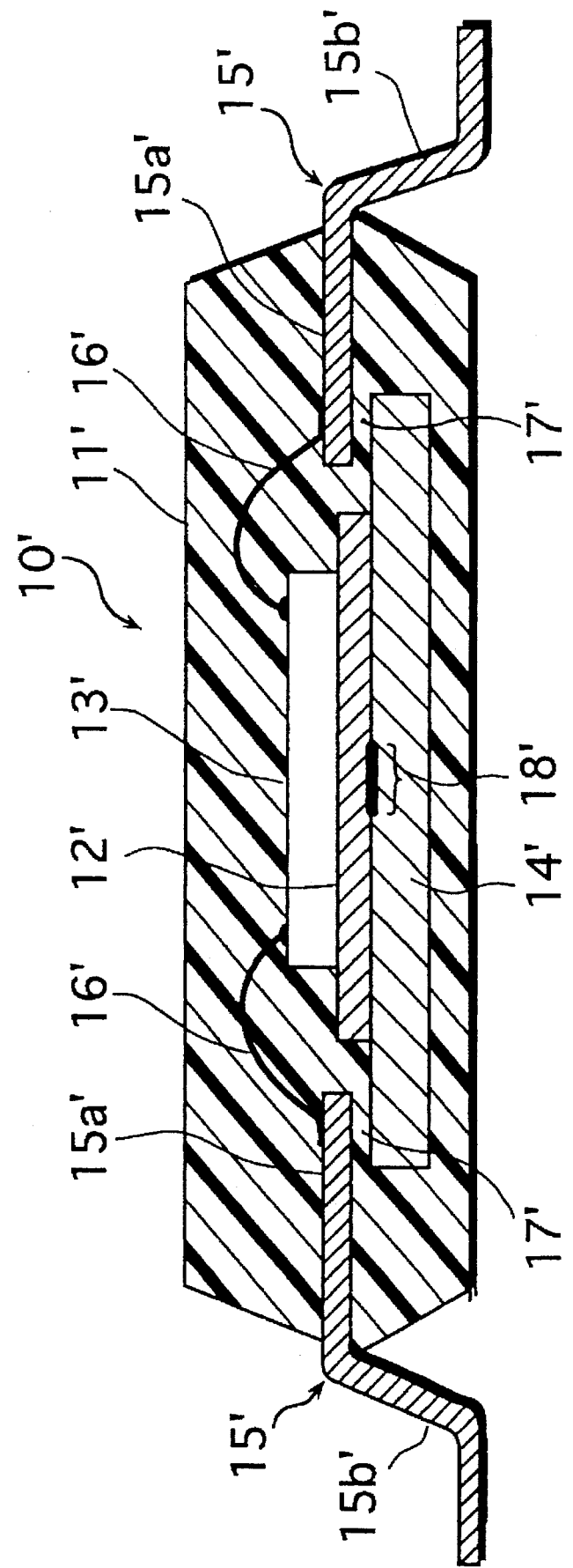
FIG. 15 is a sectional view showing a packaged semiconductor device according to a second embodiment of the present invention.

FIG. 15 shows a semiconductor device according to a second embodiment of the present invention. The semiconductor device of this embodiment generally designated by reference numeral 10' is similar to that of the first embodiment (FIGS. 1 and 2), so that the same reference numerals as used for the first embodiment are also used with a prime (') for corresponding elements of the second embodiment. The only difference between the first and second embodiments resides in that the heat sink plate 14' of the latter embodiment is completely enclosed in the resin package 11' without direct exposure to the exterior.

FIGS. 16 through 20 show a modified process for making a semiconductor device according to a third embodiment of the present invention. In this embodiment, the same reference numerals as used for the first embodiment are also used with a double prime (") to indicate corresponding elements.

Figure 16:
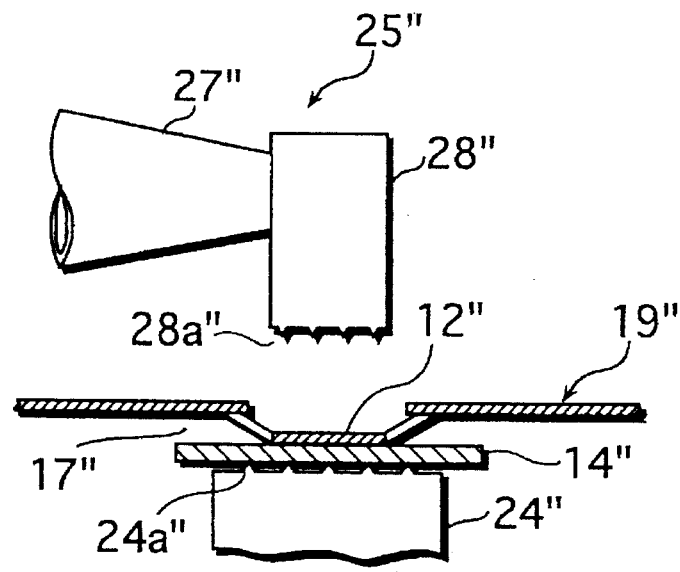
FIGS. 16 through 18 are sectional views showing a modified method of binding a die pad to a heat sink plate.
Figure 17:
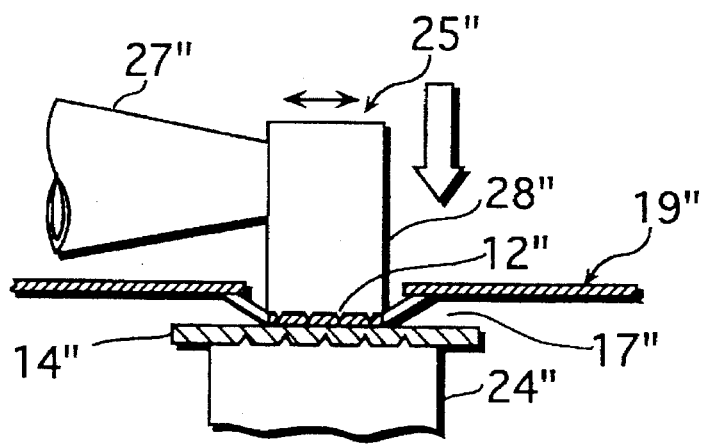
Figure 18:
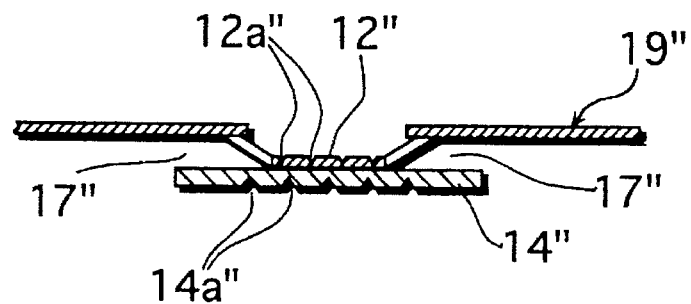

According to the third embodiment, bonding between the die pad 12" and the heat sink plate 14" is performed in the manner shown in FIGS. 16 and 17. Specifically, the heat sink plate 14" is supported on a support base 24 which has a plurality of upwardly directed minute teeth 24a", and the die pad 12" is placed on the heat sink plate 14", as shown in FIG. 16. In this condition, a presser tool 28" having a plurality of downwardly directed minute teeth 28a" is lowered into pressing contact with the die pad 12" and supersonically vibrated by a supersonic generator (not shown) via a horn 27", as shown in FIG. 17. As a result, the die pad 12" is supersonically fused or bonded to the heat sink plate 14", as shown in FIG. 18.

In the die pad bonding step described above, the teeth 28a" of the presser tool 28" come into non-sliding engagement with the die pad 12", whereas the teeth 24a" of the support base 24" come into non-sliding engagement with the heat sink plate 14". Thus, the supersonic energy of the presser tool 28" is effectively transmitted to the die pad 12" and converted into frictional heat for effectively bonding the die pad 12" to the heat sink plate 14". In FIG. 18, the depressions of the heat sink plate 14" and die pad 12" formed by the respective teeth 24a", 28a" are indicated by reference numerals 12a", 14a", respectively.

Figure 19:
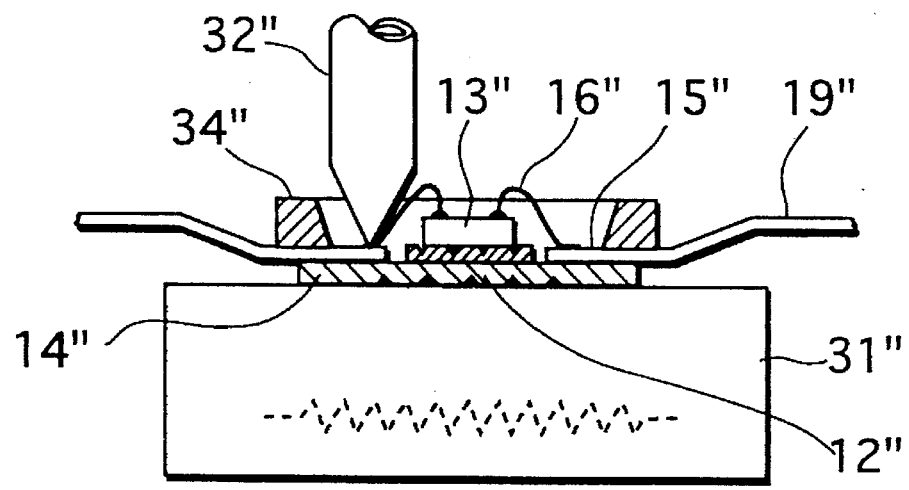
FIG. 19 is a sectional view showing a modified method of wire bonding.

Further, according to the third embodiment, use is made of an annular presser member 34" for simultaneously pressing all of the leads 15" against the heat sink plate 14" in the second wire bonding step, as shown in FIG. 19. Apparently, the annular presser member 34" stabilizes the position of the respective leads 15" relative to each other and to the heat sink plate 14", thereby facilitating the second wire bonding step. Each of the leads 15" will restore to its natural state after removal of the annular presser member 34", so that a suitable spacing 17" (see FIGS. 16–18) is formed between the heat sink plate 14" and the lead 15".

Figure 20:
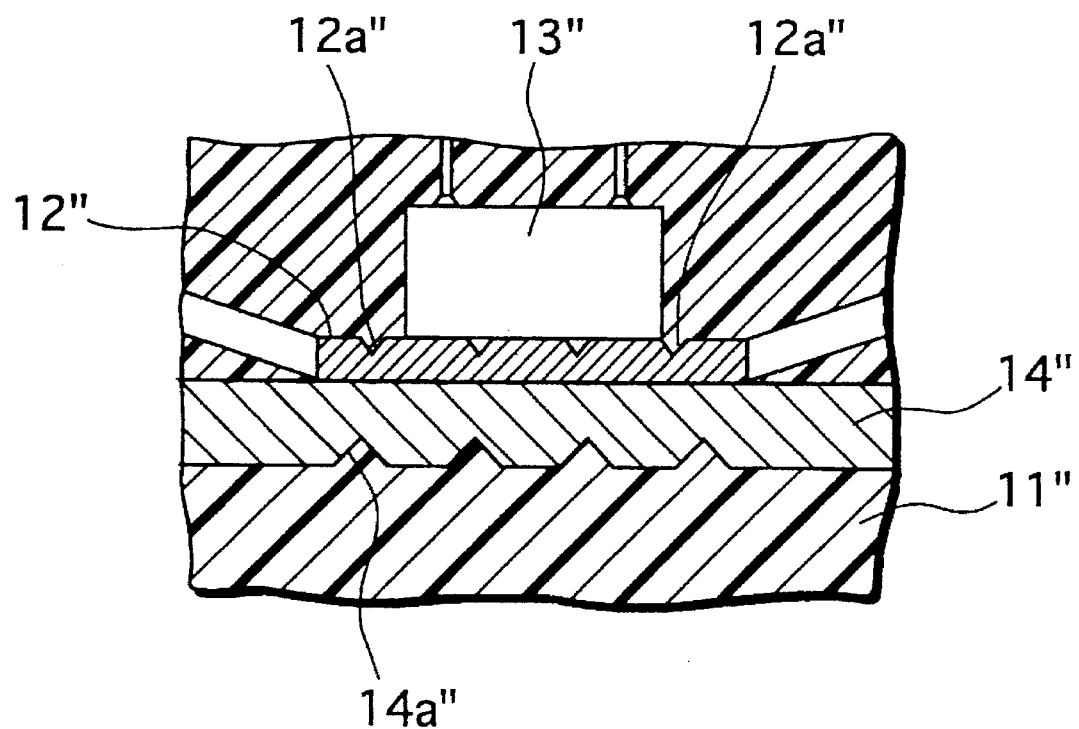
FIG. 20 is an enlarged fragmentary sectional view showing a packaged semiconductor device according to a third embodiment of the present invention.

In addition to the advantages described above, the third embodiment is also advantageous for the following reasons. Specifically, as shown in FIG. 20, when a resin package 11" is later formed to fully enclose the heat sink plate 14", the resin material for the package 11" enters in the respective depressions 12a", 14a" of the die pad 12" and heat sink plate 14" to increase the contact area. As a result, the bonding of the package 11" relative to the die pad 12" and the heat sink plate 14" is greatly reinforced to prevent unexpected dislocation of these parts within the package 11" and/or cracking of the package 11" due to such dislocation. Further, if the package 11" is so formed as to expose the bottom surface of the heat sink plate 14", the depressions 14a" will increase the heat dissipating area of the heat sink plate 14" to correspondingly enhance heat dissipation.

While, in the third embodiment, the presser tool 28" is shown to come into full contact with the die pad 12", the presser tool 28" may be made to come into contact with only a limited central portion of the die pad 12", as described for the first embodiment (see FIGS. 8 and 9).

Figure 21:
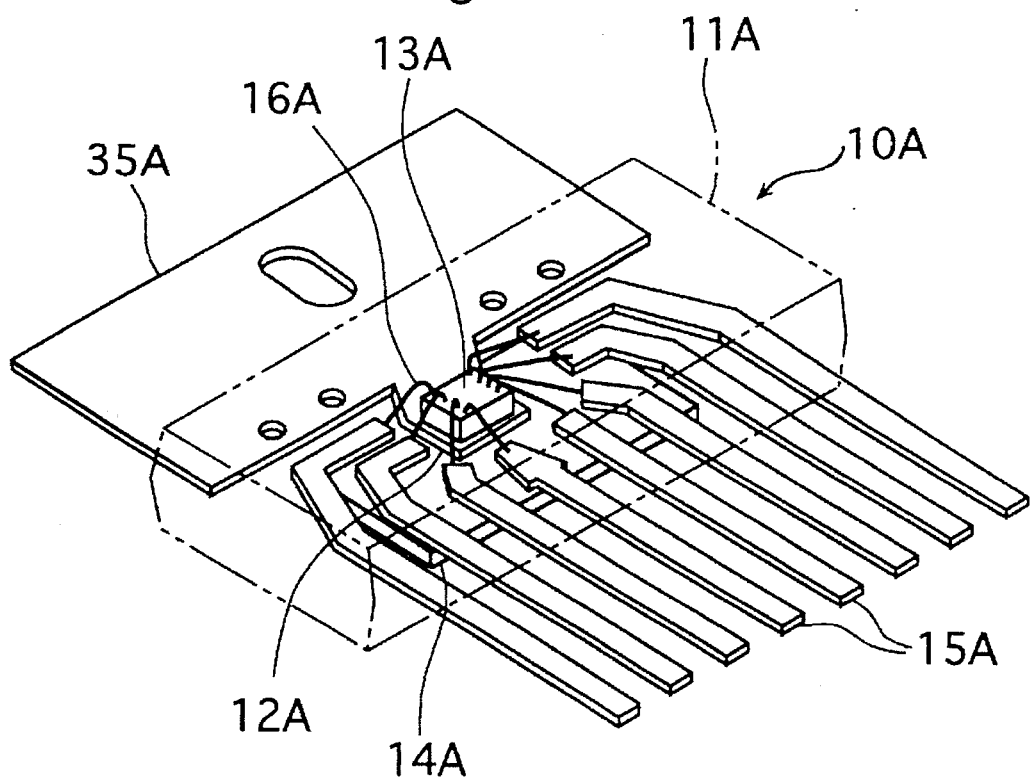
FIG. 21 is a perspective view showing a packaged semiconductor device according to a fourth embodiment of the present invention.

FIG. 21 shows a semiconductor device 10A according to a fourth embodiment of the present invention. The device 10A of this embodiment is a single-in-line type semiconductor device having a heat dissipation fin 35A which extends out of a resin package 11A. The fin 35A is integral with a die pad 12A which is mounted on a heat sink plate 14A, and a semiconductor chip 13A is mounted on the die pad 12A. A plurality of leads 15A are electrically connected to the chip 13A through respective bondwires 16A inside the package 11A but extend out of the package 11A from one side thereof. The semiconductor device 10A of the fourth embodiment is otherwise similar to the semiconductor device 10 of the first embodiment (FIGS. 1 and 2) and may be made substantially in the same manner (FIGS. 3–14 or 16–20).

Figure 22:
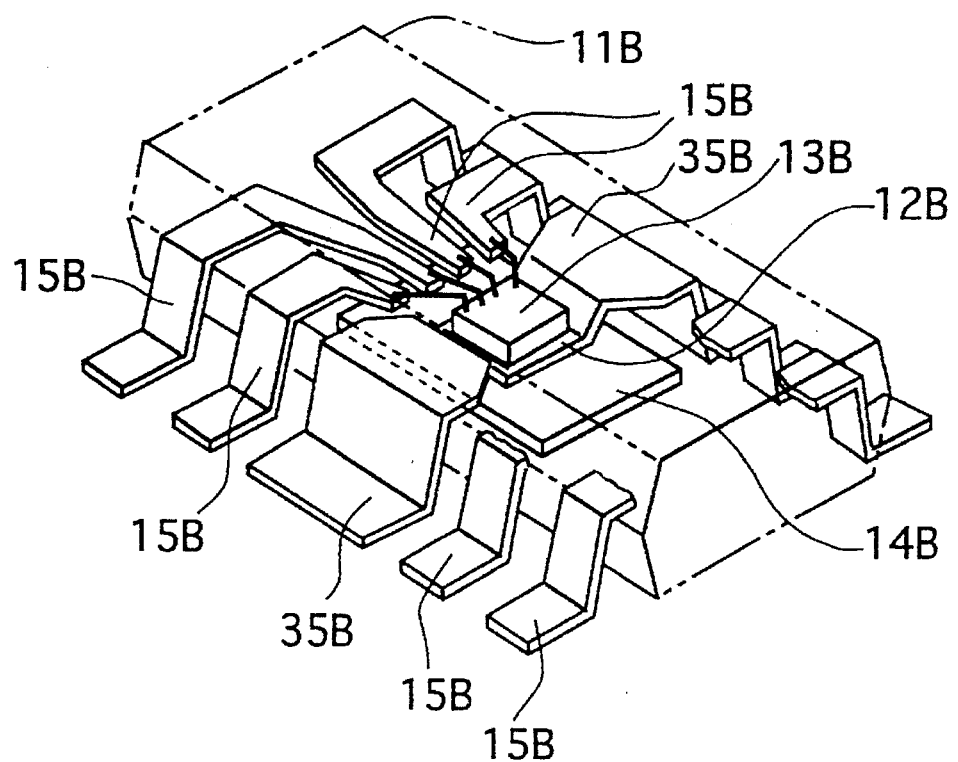
FIG. 22 is a perspective view showing a packaged semiconductor device according to fifth embodiment of the present invention.

FIG. 22 shows a semiconductor device 10B according to a fifth embodiment of the present invention. The device 10B of this embodiment is a dual-in-line type semiconductor device having a pair of heat dissipation fins 35B each of which extends out of a resin package 11B. The respective fins 35B are integral with a die pad 12B which is mounted on a heat sink plate 14B, and a semiconductor chip 13B is mounted on the die pad 12B. A plurality of leads 15B are electrically connected to the chip 13A through respective bondwires 16B inside the package 11B but extend out of the package 11B from both sides thereof. The semiconductor device 10B of the fifth embodiment is otherwise similar to the semiconductor device 10 of the first embodiment (FIGS. 1 and 2) and may be made substantially in the same manner (FIGS. 3–14 or 16–20).

Figure 23:
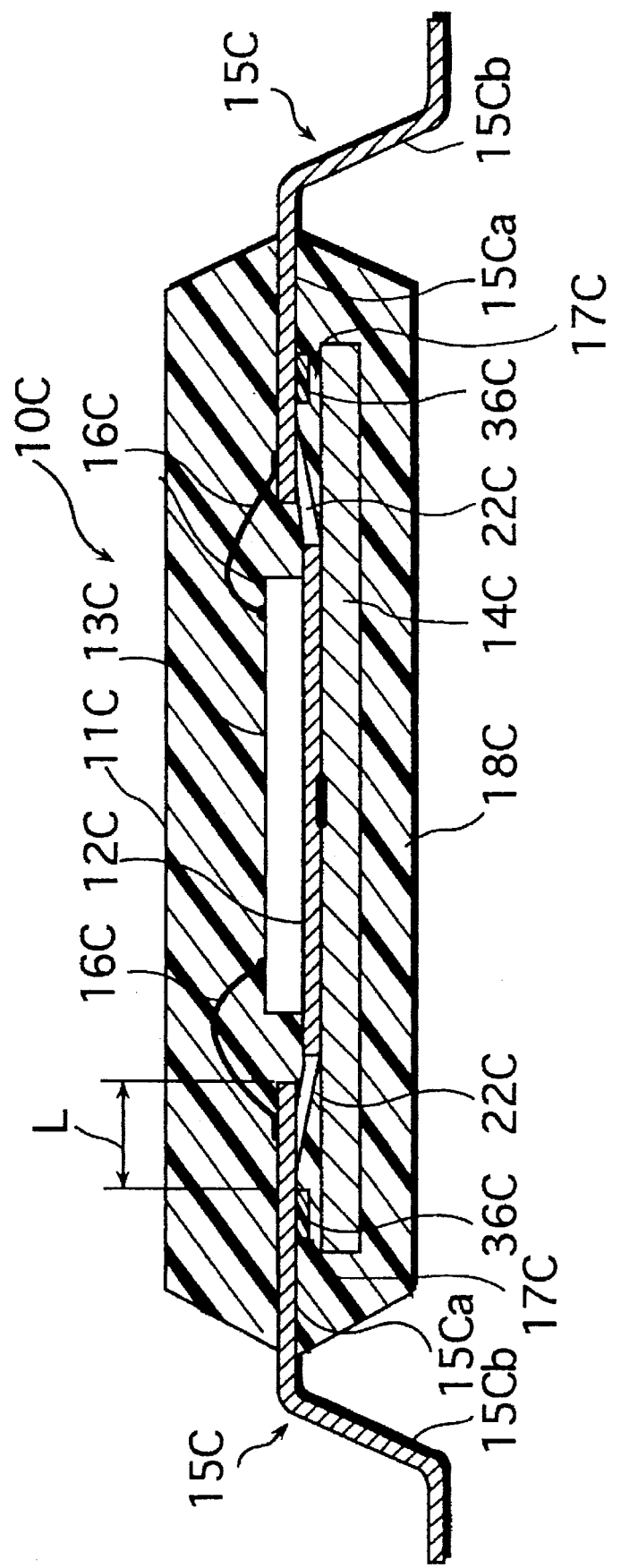
FIG. 23 is a sectional view showing a packaged semiconductor device according to a sixth embodiment of the present invention.

FIG. 23 of the accompanying drawings illustrate a squad type packaged semiconductor device according to a sixth embodiment of the present invention. The semiconductor device generally designated by reference numeral 10C comprises a resin package 11C which encloses a semiconductor chip 13C bonded on a die pad or island 12C. The die pad 12C is bonded to a heat sink plate 14C only in a limited central region 18C but held in direct contact therewith as a whole, similarly to the arrangement of the first embodiment (FIGS. 1 and 2). The die pad 12C may be rectangular or square with each of the four corners connected to a support bar 22C.

The semiconductor chip 13C is electrically connected to a plurality of leads 15C via respective bondwires 16C. Each of the leads 15C has an inner flat portion 15Ca located within the package 11C, and an outer bent portion 15Cb extending out of the package 11C. The outer bent portion 15Cb is bent to become substantially flush with the bottom surface of the package 11C for conveniently mounting on a circuit board (not shown).

The heat sink plate 14C is completely enclosed in the package 11C, so that the bottom surface of the heat sink plate 14C is not exposed to the exterior. Thus, the heat generated by the semiconductor chip 13C in operation is transmitted to the heat sink plate 14C for dissipation indirectly through the resin material of the package 11C.

The heat sink plate 14C has marginal portions which laterally overlap the inner flat portions 15Ca of the respective leads 15C with a small spacing 17C. The resin material of the package 11C occupies the spacing 17C, so that the respective leads 15C are electrically insulated from the heat sink plate 14C.

According to the sixth embodiment shown in FIG. 23, the inner flat portions 15Ca of the respective leads 15C are connected to each other by an annular insulating adhesive tape 36C. The use of such an adhesive tape is particularly advantageous for preventing the respective leads 15C from unexpectedly contacting each other in wire bonding where the leads 15C are crowdedly arranged, as more specifically described below. The adhesive tape 36C may be made of a polyimide film to which an adhesive material is applied.

The packaged semiconductor device according to the sixth embodiment may be preferably made in the following manner.

Figure 24:
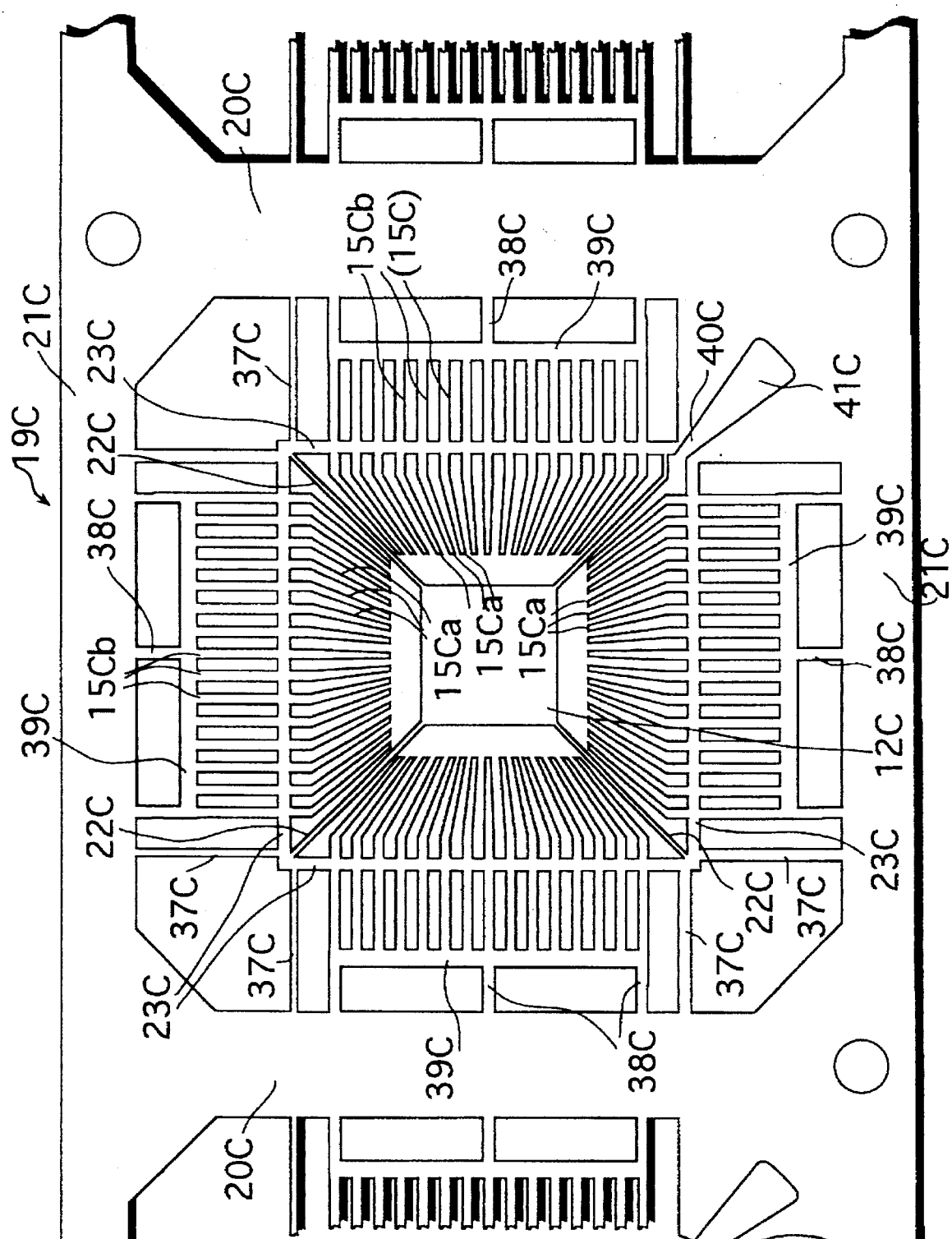
FIG. 24 is a plan view showing a leadframe used for making the semiconductor device illustrated in FIG. 23.

First, as shown in FIG. 24, a suitably configured leadframe 19C is prepared. Such a leadframe may be prepared by punching a thin metal sheet which may be made of a copper alloy or an iron-nickel alloy for example. The leadframe 19C comprises a pair of side bands 21C connected together by a plurality of section bars 20C. Two adjacent ones of the section bars 20C define a unit region which contains a die pad 12C surrounded by four groups of leads 15C. The die pad 12C is supported by four support bars 22C extending from the four corners of the die pad 12C to a square tie bar frame 23C which is in turn supported by suspension bars 37C. The tie bar frame 23C divide each lead 15C into an inner portion 15Ca closer to the die pad 12C and an outer portion 15Cb farther from the die pad 12C. Each group of leads 15C extends from a base bar 39C which is connected to connection bars 38C. Further, the leadframe 19C is also formed with a resin passage opening 41C having a neck portion 40C at one corner of the square tie bar frame 23C.

Figure 25:
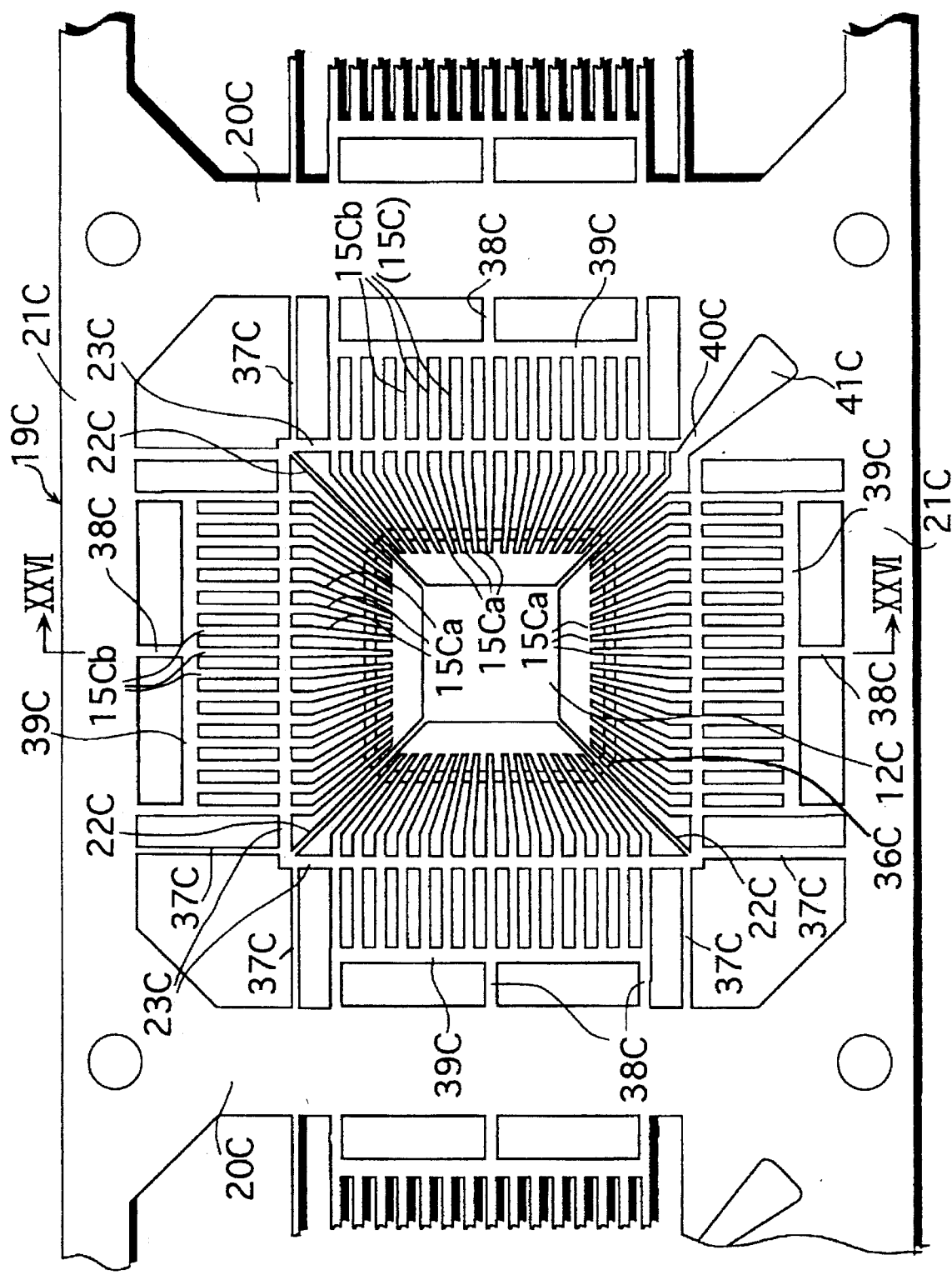
FIG. 25 is a plan view similar to FIG. 24 but showing the same leadframe after attaching an insulating adhesive tape.
Figure 26:
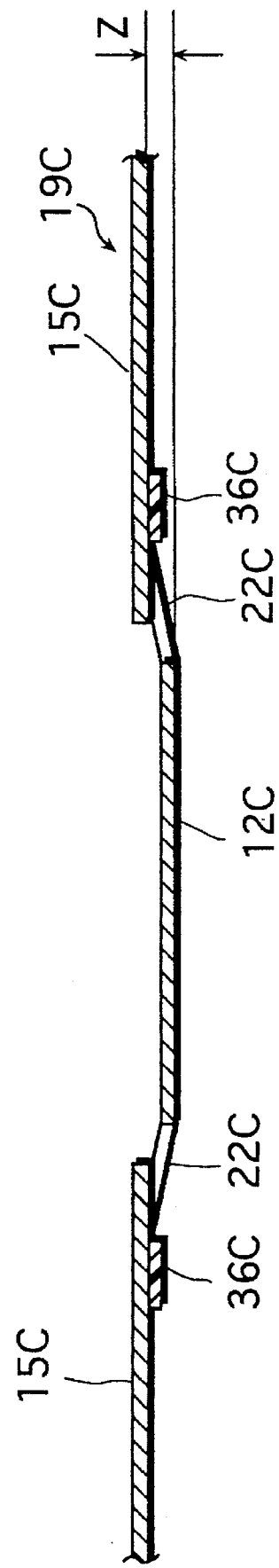
FIG. 26 is a sectional view taken on lines XXVI—XXVI in FIG. 25.

Then, as shown in FIGS. 25 and 26, an annular insulating adhesive tape 36C is attached to the underside of the respective leads 15C. As a result, the adhesive tape 36C holds the respective leads 15C as suitably spaced from each other. This is particularly advantageous in view of the fact that the leads 15C of the squad type semiconductor device may be crowdedly arranged at a minute spacing of about 200 micrometers for example while each lead 15C with a width of e.g. 80–120 micrometers is easily deformable. The adhesive tape 36C may have a thickness of 30–70 micrometers for example. It should be appreciated that the die pad 12C is downwardly offset from the normal plane of the leadframe 19C by an amount Z of 0.2–0.4 mm (200–400 micrometers), as shown in FIG. 26.

Figure 27:
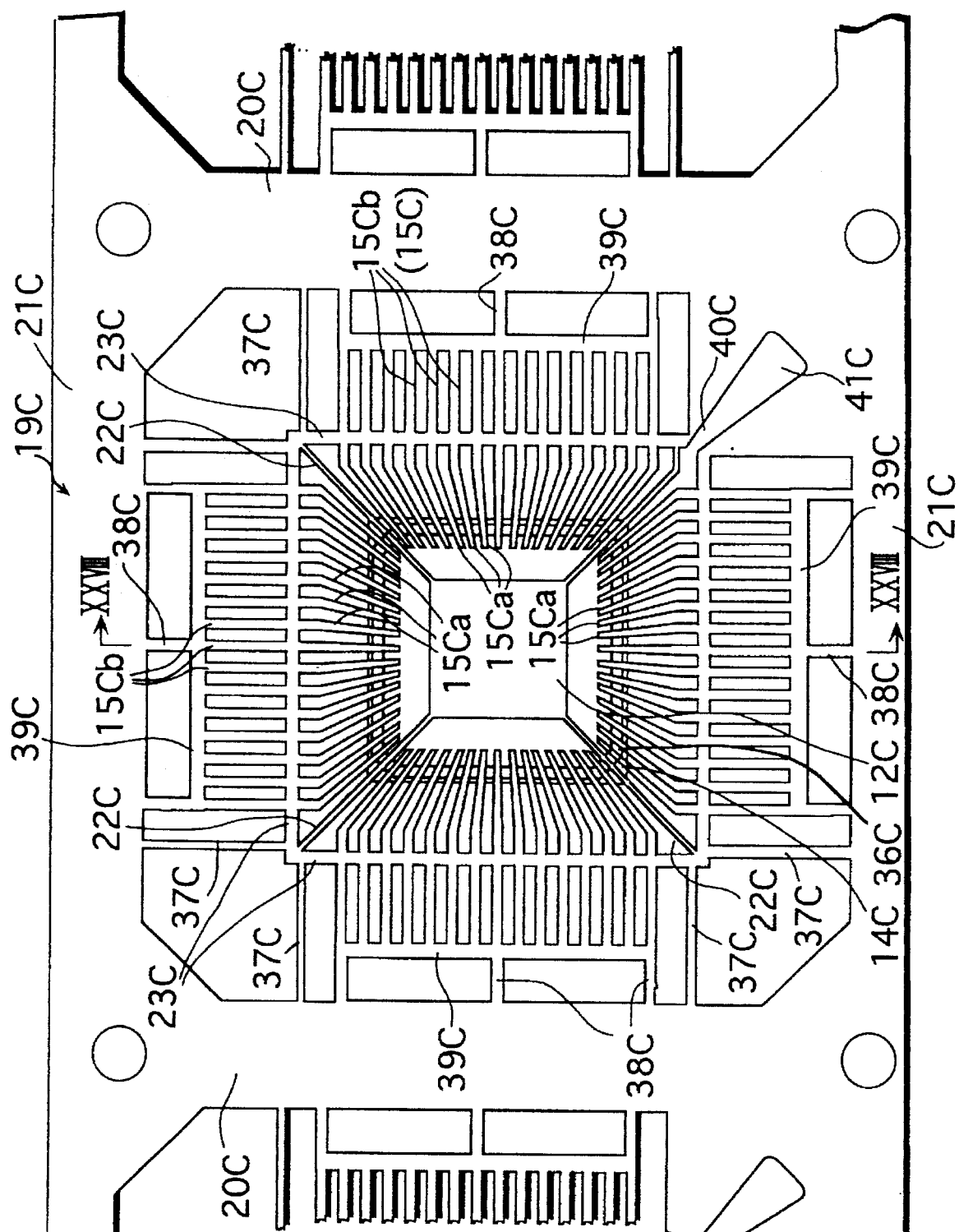
FIG. 27 is a plan view similar to FIG. 24 but showing the same leadframe after bonding a heat sink plate.
Figure 28:
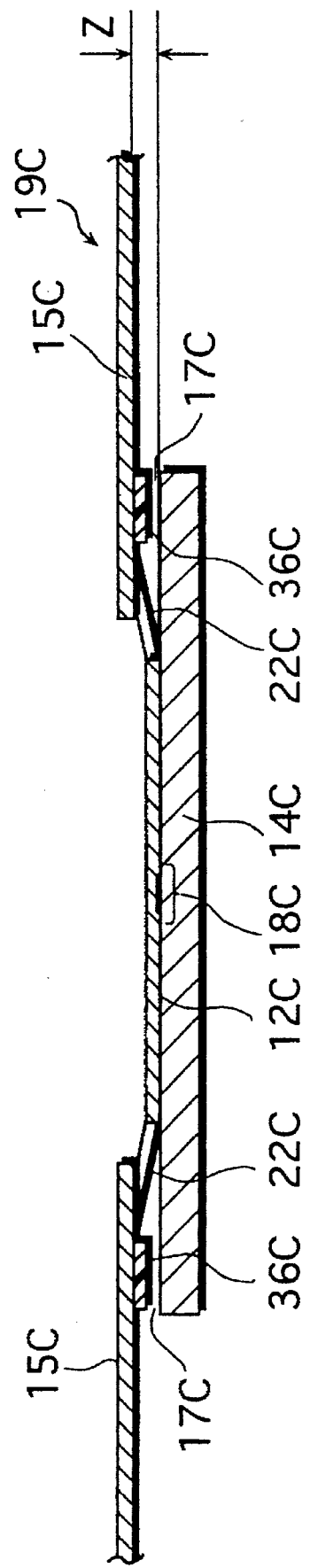
FIG. 28 is a sectional view taken on lines XXVIII—XXVIII in FIG. 27.

Then, as shown in FIGS. 27 and 28, a metallic heat sink plate 14C is bonded to the bottom surface of the die pad 12C in such a manner that a peripheral portion of the heat sink plate 14C partially overlaps the inner portions 15Ca of the respective leads 15C. As previously described, the bonding between the die pad 12C and the heat sink plate 14C is preferably effected only in a limited central region 18C. Because of the downward offset of the die pad 12C which is greater than the thickness of the adhesive tape 36C, a spacing 17C is formed between the heat sink plate 14 and the adhesive tape 36C.

Figure 29:
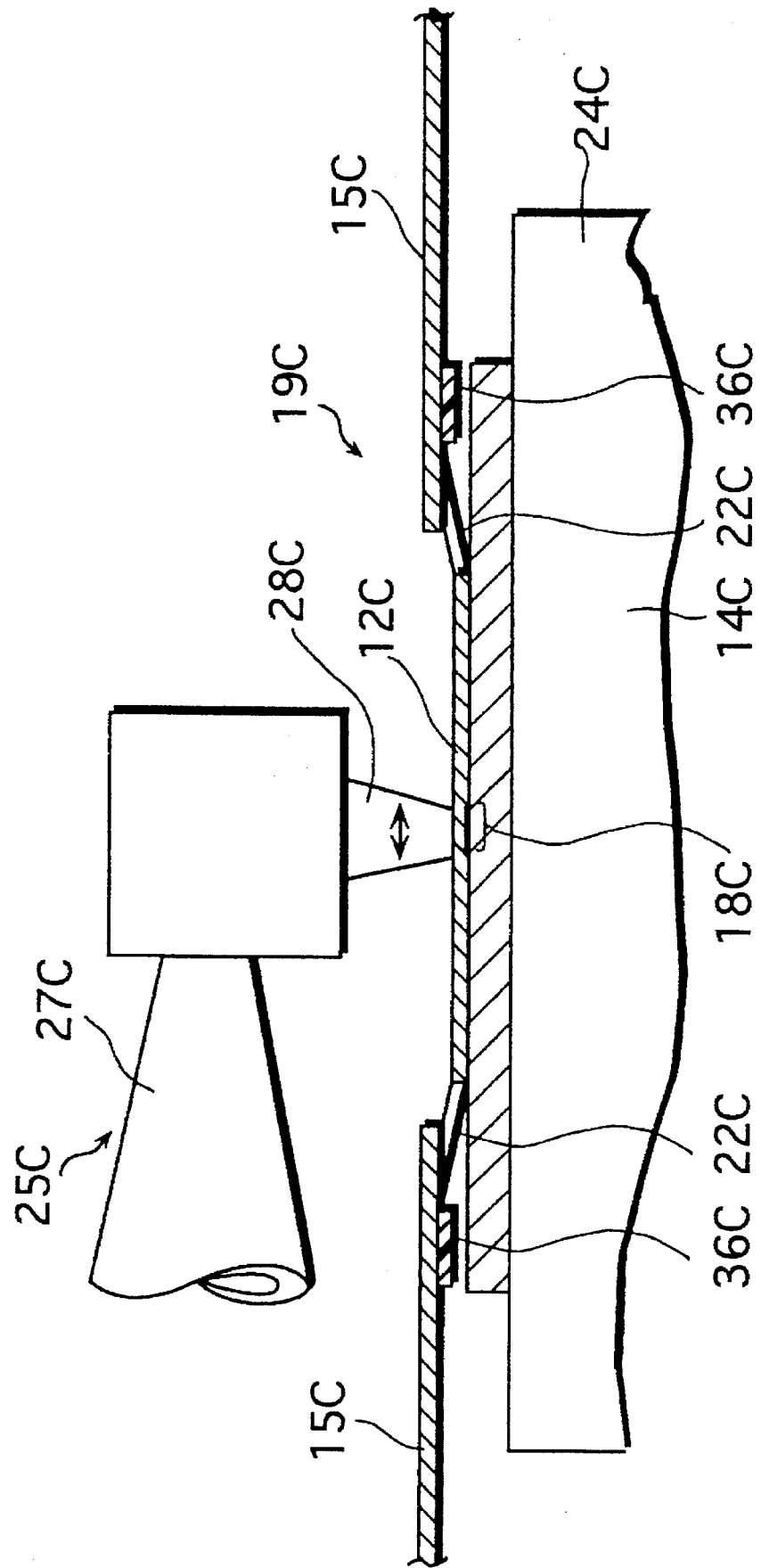
FIG. 29 is a sectional view showing the step of bonding the heat sink plate.

As previously described for the first embodiment, the heat sink plate 14C may be preferably bonded to the die pad 12C by a supersonic bonding method. FIG. 29 corresponding to FIG. 8 shows an example of such supersonic bonding. Since the supersonic bonding method has been already described in detail, no specific description is made with respect to FIG. 29 wherein the same reference numerals as used for FIG. 8 are also used with a suffix "C" to indicate corresponding parts.

Figure 30:
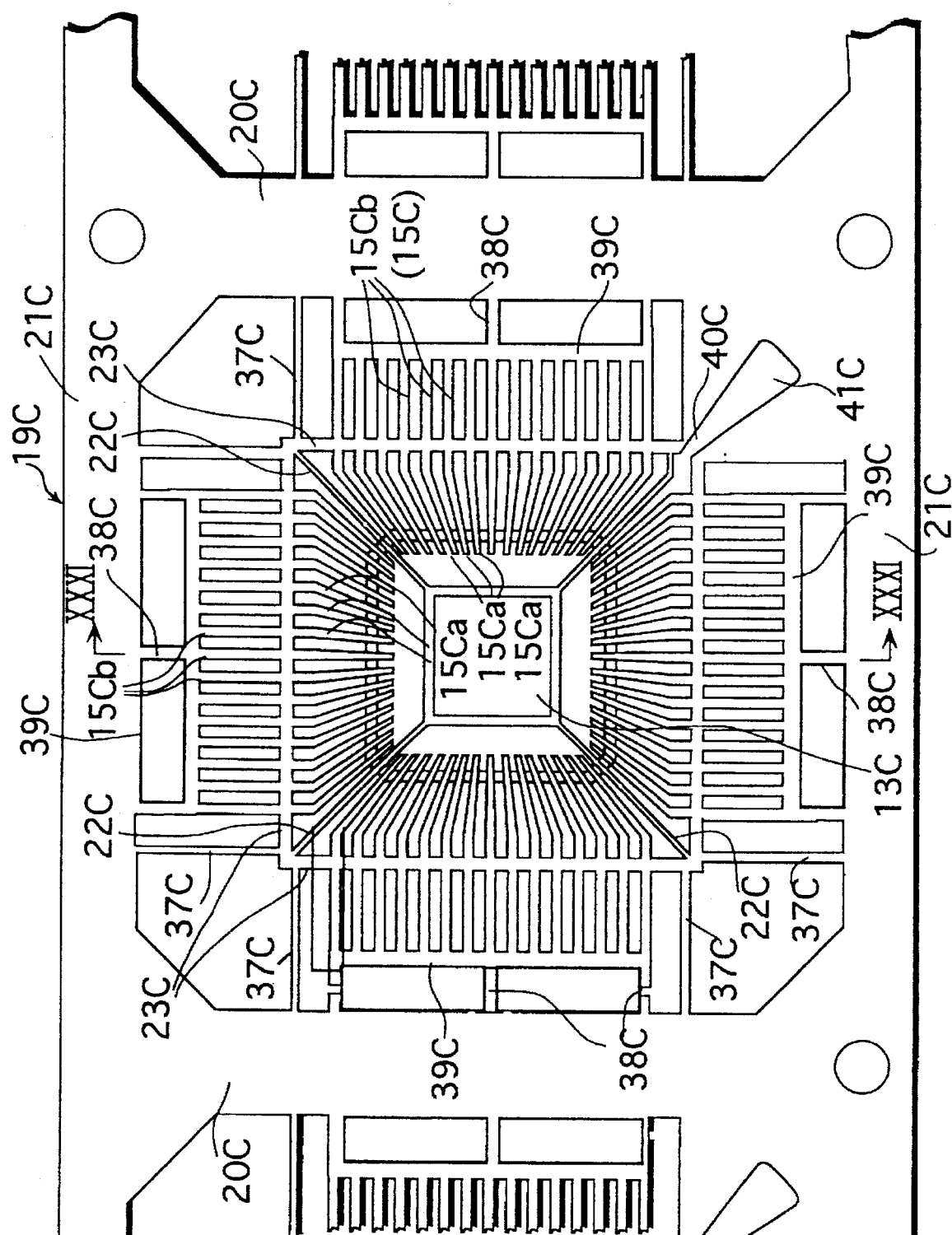
FIG. 30 is a plan view similar to FIG. 24 but showing the same leadframe after bonding a semiconductor chip.
Figure 31:
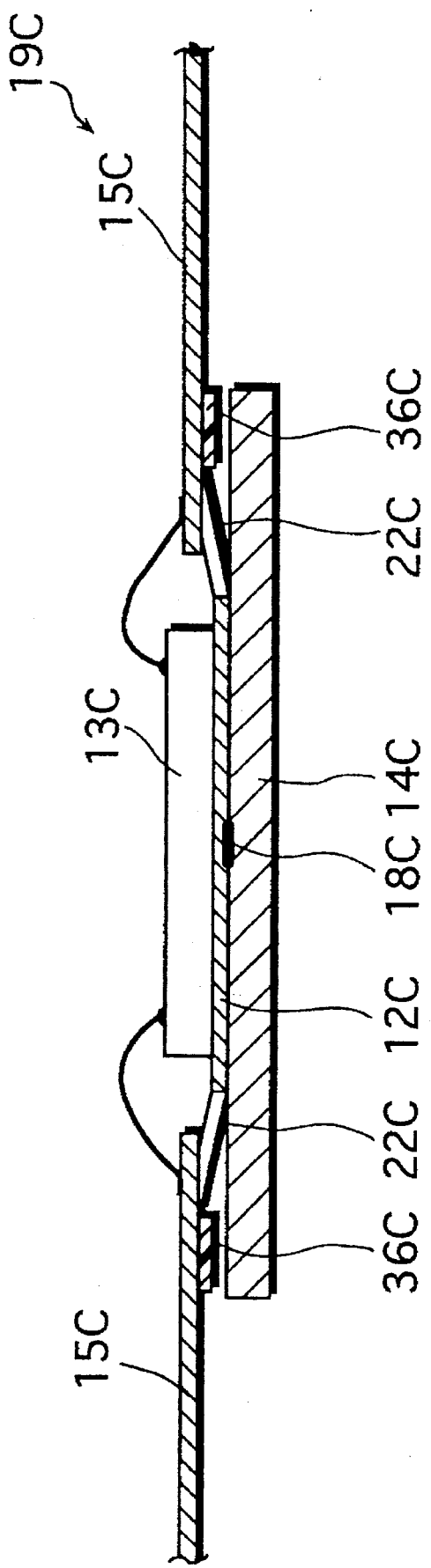
FIG. 31 is a sectional view taken on lines XXXI—XXXI in FIG. 30.

After bonding between the die pad 12C and the heat sink plate 14C, a semiconductor chip 13C is bonded on the die pad 12C by soldering or by using a silver paste, as shown in FIGS. 30 and 31.

Figure 32:
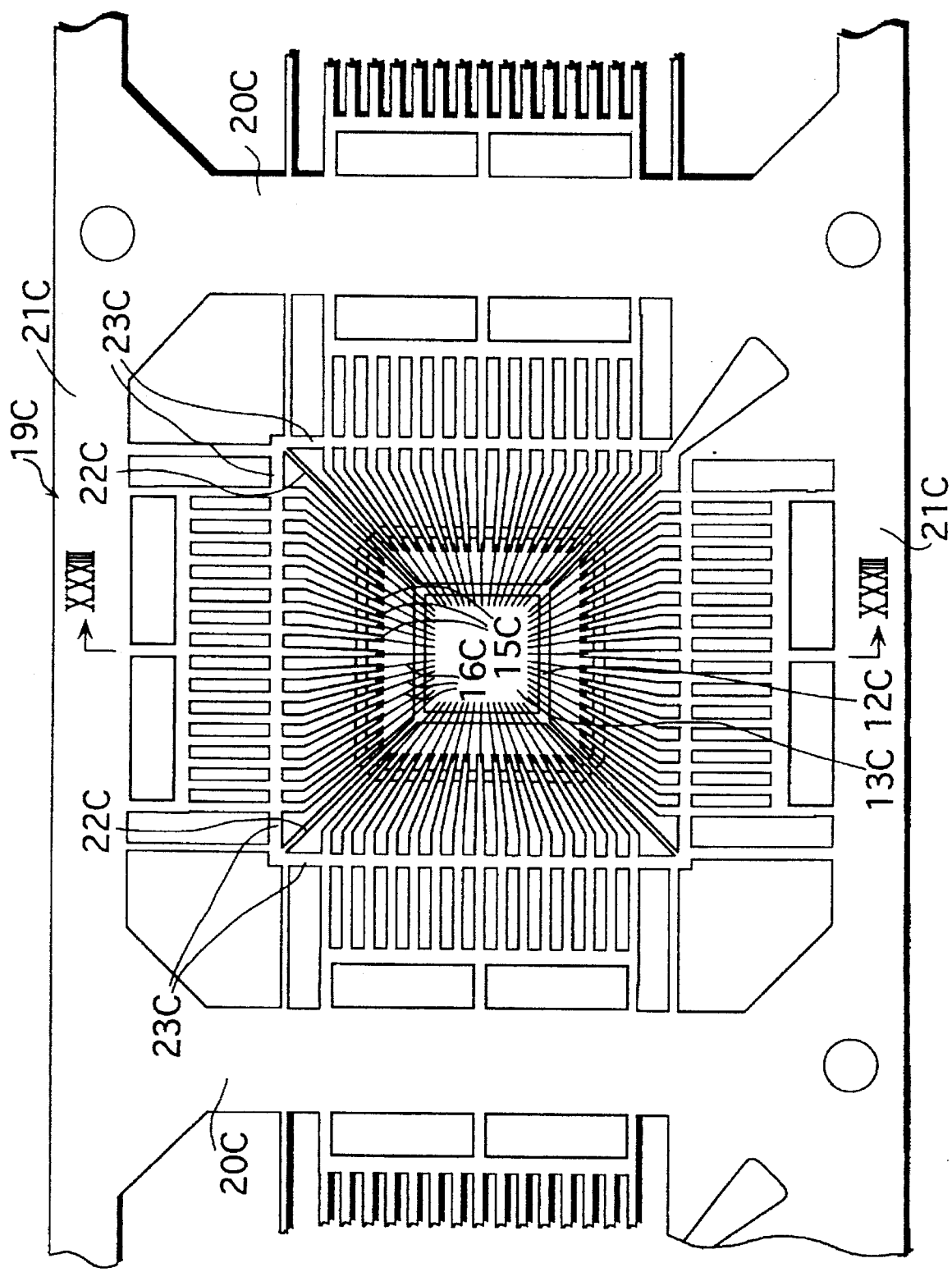
FIG. 32 is a plan view similar to FIG. 24 but showing the same leadframe after wire bonding.
Figure 33:
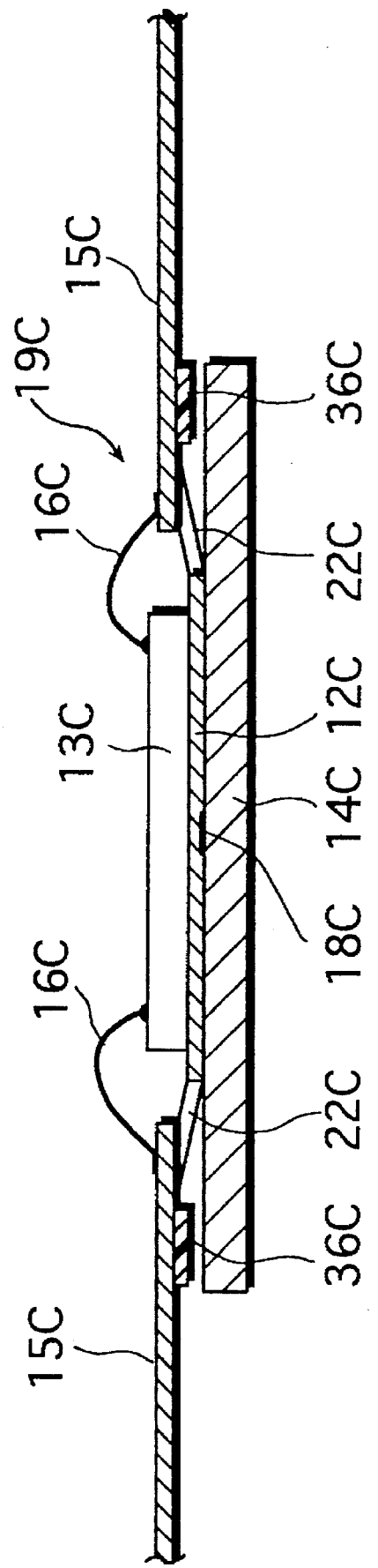
FIG. 33 is a sectional view taken on lines XXXIII—XXXIII in FIG. 32.
Figure 34:
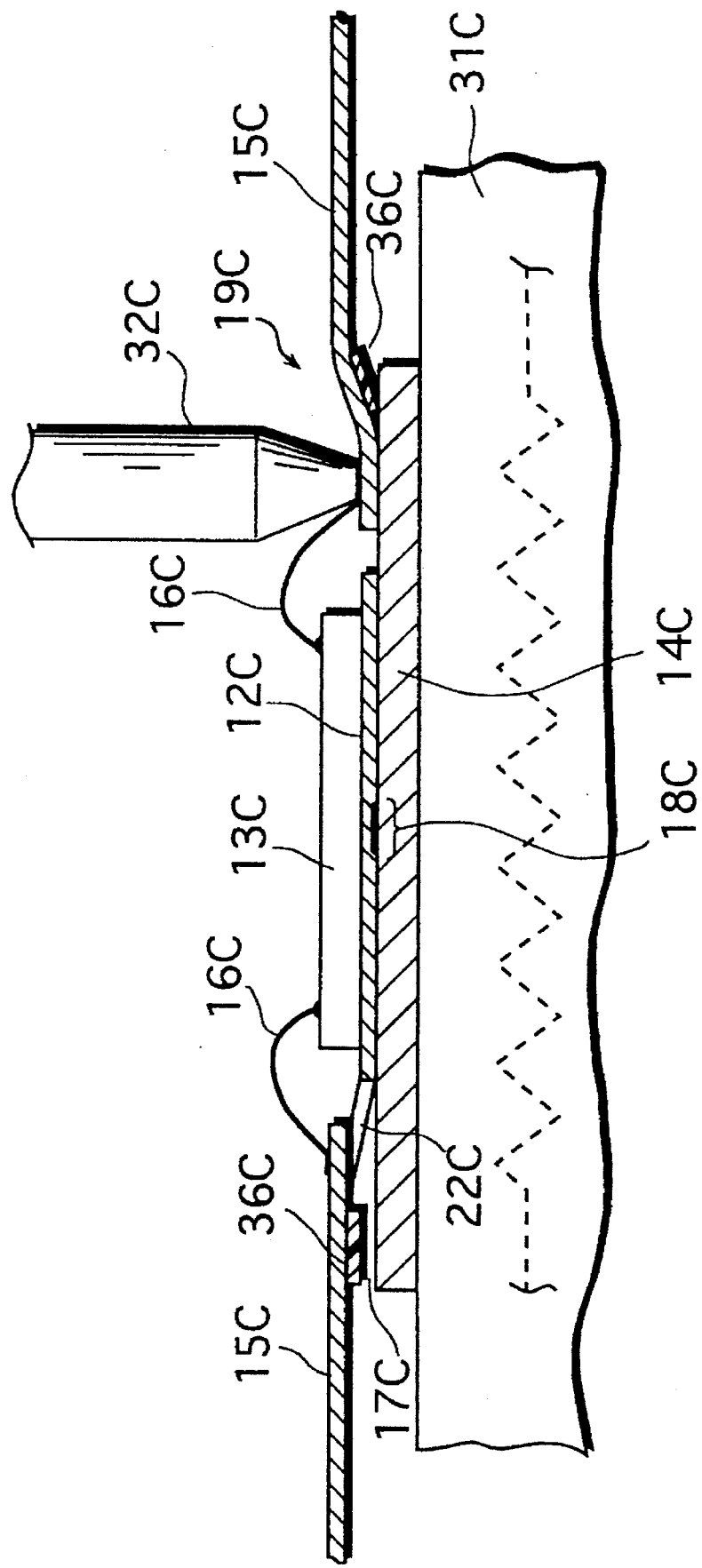
FIG. 34 is a sectional view showing how the wire bonding process is performed.

Then, as shown in FIGS. 32 through 34, the semiconductor chip 13C is electrically connected to the inner portion 15Ca of each lead 15C through a bondwire 16C. Such wire bonding may be performed by using a heater block 31C and a capillary tool 32C substantially in the same manner as already described for the first embodiment (see FIGS. 12 and 13).

Figure 35:
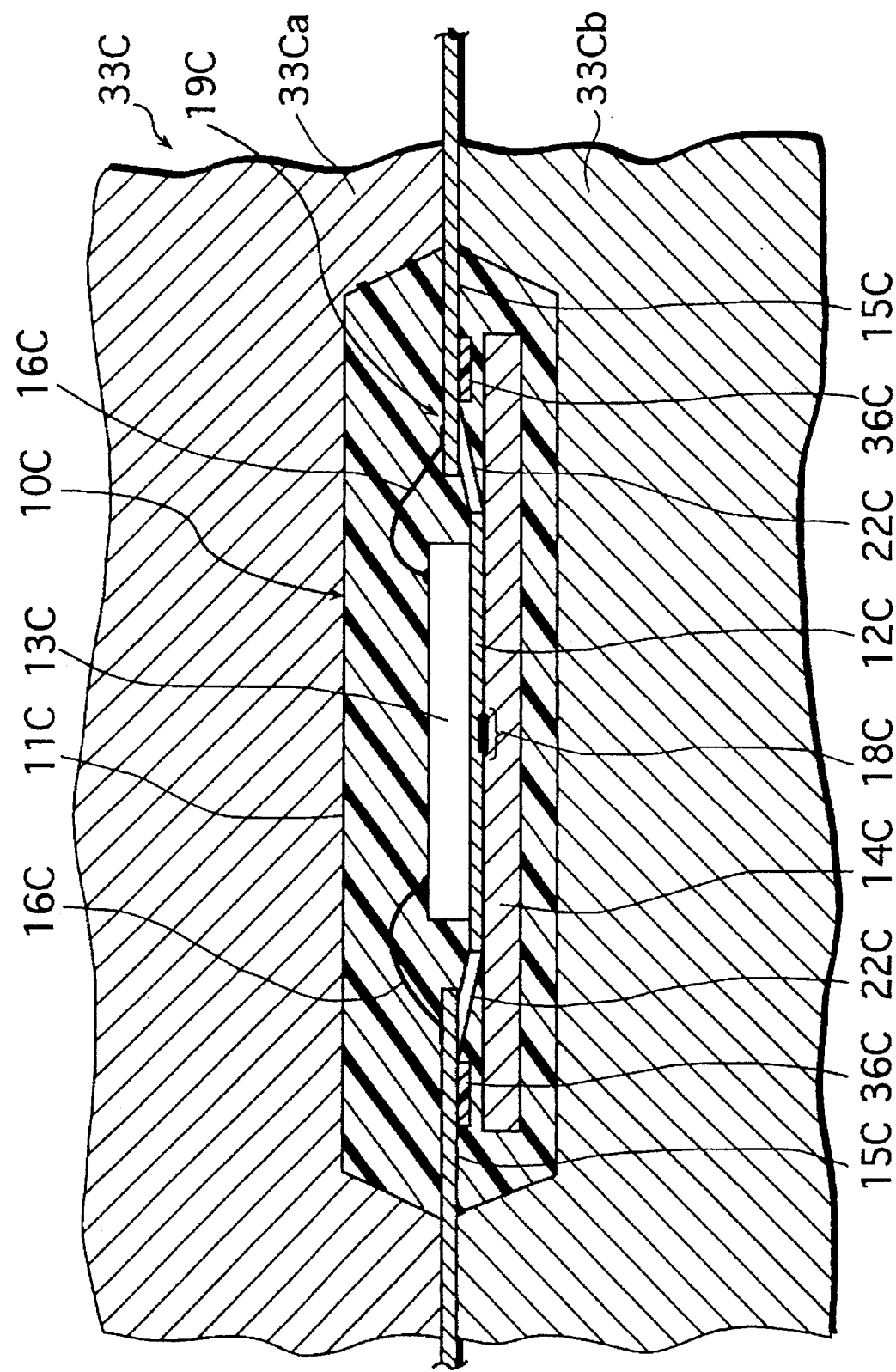
FIG. 35 is a sectional view showing the step of molding a resin package.
Figure 36:
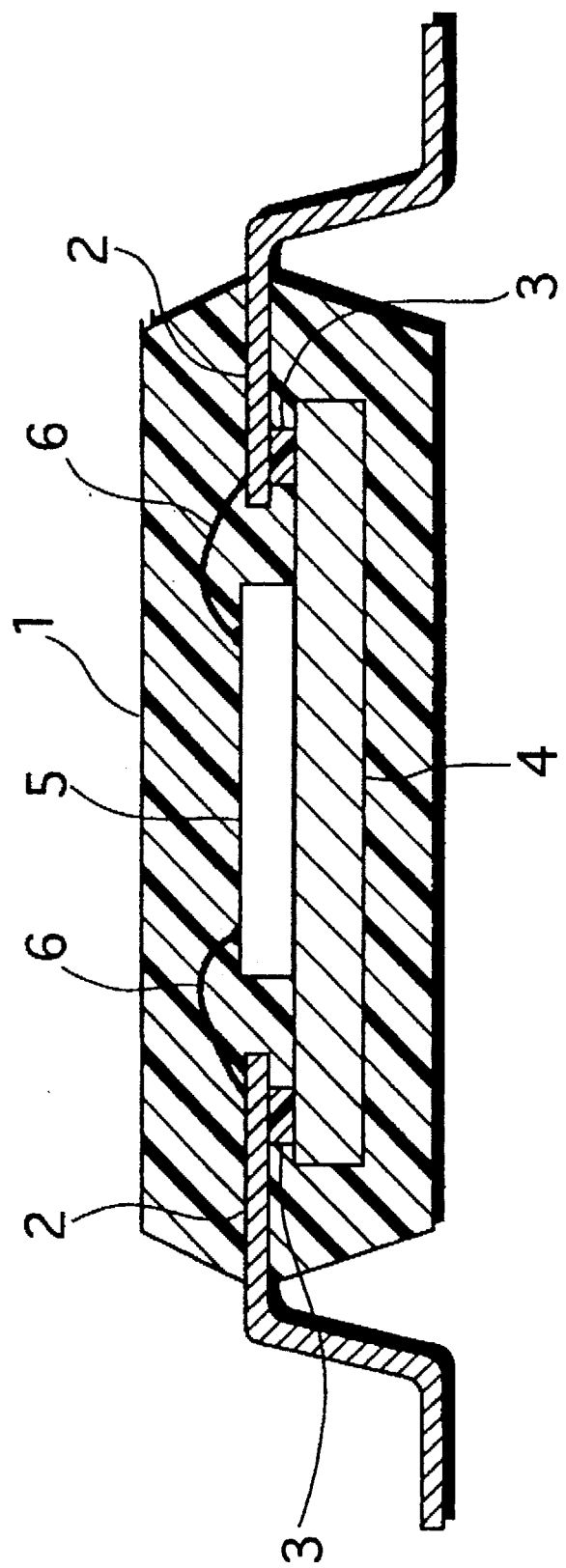
FIG. 36 is a sectional view showing a prior art packaged semiconductor device.

Then, as shown in FIG. 35, the semiconductor chip 13C together with its associated elements is placed in a mold 33C which includes an upper mold member 33Ca and a lower mold member 33Cb, and a known transfer molding step is carried out to form a package 11C of an epoxy resin.

Thereafter, other necessary steps are performed which include solder plating of the leadframe 19C, marking the resin package 11C, cutting of the leadframe 19C, bending of the leads 15C, and so on. As a result, the individual semiconductor device 10C shown in FIG. 23 is thus obtained.

The sixth embodiment described above may be modified so that the adhesive tape 36C rests directly on the heat sink plate 14C. In this case, the insulating adhesive tape 36C serves to insulate the respective leads 15C from the heat sink plate 14C and from each other.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

We claim:

1. A packaged semiconductor device comprising:

a die pad;

a semiconductor chip mounted on the die pad;

a plurality of leads electrically connected to the semiconductor chip;

a heat sink plate bonded to the die pad opposite to the semiconductor chip, the heat sink plate having a peripheral portion partially overlapping each of the leads but electrically insulated therefrom; and a resin package enclosing at least the semiconductor chip together with the die pad and a part of each said lead;

wherein the die pad has a contact surface for direct contact with the heat sink plate;

wherein the heat sink plate is directly bonded to the die pad only in a limited central region without intervention of a separate bonding layer; and wherein the limited central region is smaller than said contact surface.

2. The device according to claim 1, wherein each said lead is electrically insulated from the heat sink plate by a spacing therebetween.

3. The device according to claim 1, wherein each said lead is electrically insulated from the heat sink plate by an insulating adhesive tape attached to each said lead.

4. The device according to claim 1, wherein each said lead is electrically insulated from the heat sink plate by a spacing therebetween as well as by an insulating adhesive tape attached to each said lead.

5. The device according to claim 1, wherein the heat sink plate has a surface exposed outside the resin package.

6. The device according to claim 1, wherein the heat sink plate is fully enclosed in the resin package.

7. The device according to claim 1, wherein the heat sink plate has a surface formed with depressions.

8. The device according to claim 1, wherein the die pad is integral with at least one heat dissipating fin located outside the resin package.

* * * * *